(12) United States Patent
Kim et al.

(10) Patent No.: US 12,740,235 B2
(45) Date of Patent: Sep. 15, 2026

(54) DISPLAY DEVICE

(71) Applicant: Samsung Display Co., Ltd., Yongin-si (KR)

(72) Inventors: Ji-Sun Kim, Seoul (KR); Kyunghoe Lee, Hwaseong-si (KR); Youngwan Seo, Suwon-si (KR); Keunhee Choi, Hwaseong-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 829 days.

(21) Appl. No.: 17/964,462

(22) Filed: Oct. 12, 2022

(65) Prior Publication Data

US 2023/0209892 A1 Jun. 29, 2023

(30) Foreign Application Priority Data

Dec. 23, 2021 (KR) ........................ 10-2021-0185798

(51) Int. Cl.

| | |
|---|---|
| ***H10K 59/121*** | (2023.01) |
| ***G09G 3/20*** | (2006.01) |
| ***G09G 3/3225*** | (2016.01) |
| ***G09G 3/3266*** | (2016.01) |
| ***H10K 59/131*** | (2023.01) |

(52) U.S. Cl.

CPC ......... *H10K 59/121* (2023.02); *H10K 59/131* (2023.02); *G09G 3/2088* (2013.01); *G09G 3/3225* (2013.01); *G09G 3/3266* (2013.01); *G09G 2300/0426* (2013.01); *G09G 2300/0452* (2013.01); *G09G 2300/0819* (2013.01); *G09G 2300/0861* (2013.01)

(58) Field of Classification Search

None

See application file for complete search history.

(56) References Cited

U.S. PATENT DOCUMENTS

| | | | | |
|---|---|---|---|---|
| 10,147,777 | B2 | 12/2018 | Lim et al. | |
| 2020/0098837 | A1* | 3/2020 | Bian | H10K 59/353 |
| 2021/0151519 | A1* | 5/2021 | Lv | H10K 59/352 |
| 2021/0217821 | A1* | 7/2021 | Han | H10K 59/121 |
| 2022/0013611 | A1 | 1/2022 | Park et al. | |
| 2023/0402006 | A1* | 12/2023 | Qiu | G09G 3/3233 |
| 2024/0006394 | A1* | 1/2024 | Zheng | H10K 59/121 |

FOREIGN PATENT DOCUMENTS

| | | |
|---|---|---|
| KR | 10-2018-0018960 | 2/2018 |
| KR | 10-2019-0079487 | 7/2019 |
| KR | 10-2022-0006682 | 1/2022 |

* cited by examiner

*Primary Examiner* — Chad M Dicke
*Assistant Examiner* — Dave Tan
(74) *Attorney, Agent, or Firm* — Innovation Counsel LLP

(57) ABSTRACT

A display device includes a display panel including a first display area, and a second display area adjacent to the first display area, and a panel driver overlapping the second display area of the display panel. The display panel further includes light emitting reference units each including light emitting elements and being disposed in the second display area, and driving reference units each including driving circuits and being electrically connected to a corresponding light emitting reference unit among the light emitting reference units. An arrangement order of the light emitting reference units is different from an arrangement order of the driving reference units corresponding to the light emitting reference units.

20 Claims, 16 Drawing Sheets

A2
GDC2
B_PD2
B_ED21
B_ED22
PXB2
G2_PD2
G2_ED21
G2_ED22
PXG4
R_PD2
R_ED21
R_ED22
PXR2
G1_PD2
G1_ED21
G1_ED22
PXG3
R_PD2
G1_PD2
G2_PD2
B_PD2
DRU
R_ED21
R_ED22
B_ED21
B_ED22
G1_ED21
G1_ED22
G2_ED21
G2_ED22
LRU
PXR2
PXG3
PXG4
PXB2
RU2
PXR1
R_ED1
R_PD1
PXG1
G1_PD1
G1_ED1
RU1
PXB1
B_PD1
B_ED1
PXG2
G2_ED1
G2_PD1

LRU4_2
LRU4_1
R_ED22
G2_ED23
G1_ED23
B_ED23
G1_ED22
LRU3_2
CL3_2
R_ED23
CL1_2
CL2_12
B_ED22
CL2_11
LRU3_1
G2_ED22
GDC2
SA2
SA1
DRU3_2
DRU4_2
DRU4_1
DRU3_1
R_ED21
G1_ED21
CL3_1
CL1_1
B_ED21
G2_ED21
CL2_21
CL2_22
RL1
RL3
RL2_1
RL2_2
G1_PD2
R_PD2
G2_PD2
B_PD2
LRU3_1 LRU3_2 } LRU3
LRU4_1 LRU4_2 } LRU4
DRU3_1 DRU3_2 } DRU3
DRU4_1 DRU4_2 } DRU4

FIG. 6B

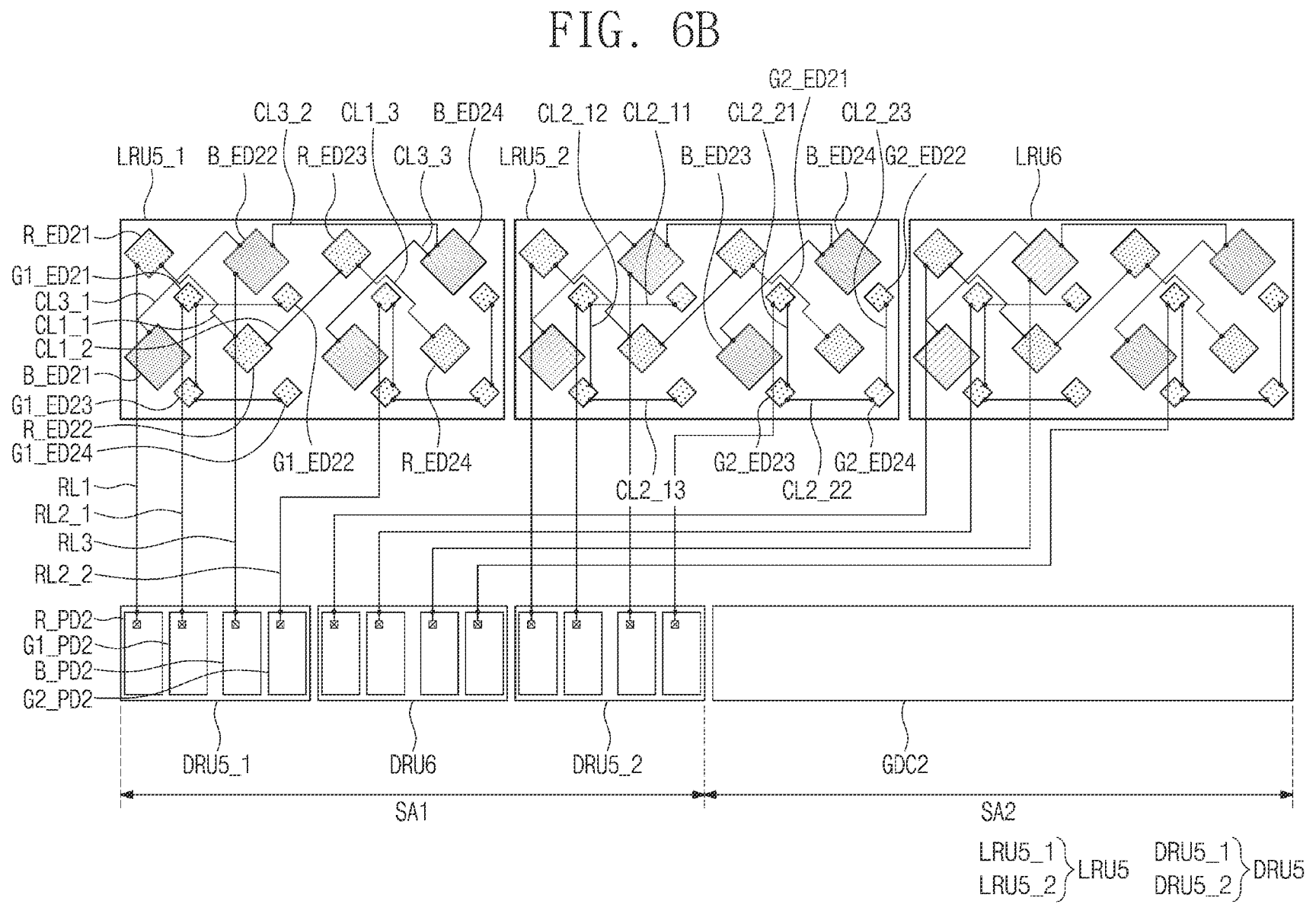

LRU6
G2_ED22
CL2_23
G2_ED24
B_ED24
G2_ED21
CL2_22
CL2_21
G2_ED23
B_ED23
CL2_11
CL2_13
CL2_12
LRU5_2
B_ED24
CL3_3
R_ED24
CL1_3
R_ED23
CL3_2
G1_ED22
B_ED22
LRU5_1
R_ED21
G1_ED21
CL3_1
CL1_1
CL1_2
B_ED21
G1_ED23
R_ED22
G1_ED24
RL1
RL2_1
RL3
RL2_2
R_PD2
G1_PD2
B_PD2
G2_PD2
DRU5_1
DRU6
DRU5_2
GDC2
SA1
SA2
LRU5_1
LRU5_2
LRU5
DRU5_1
DRU5_2
DRU5

FIG. 7A

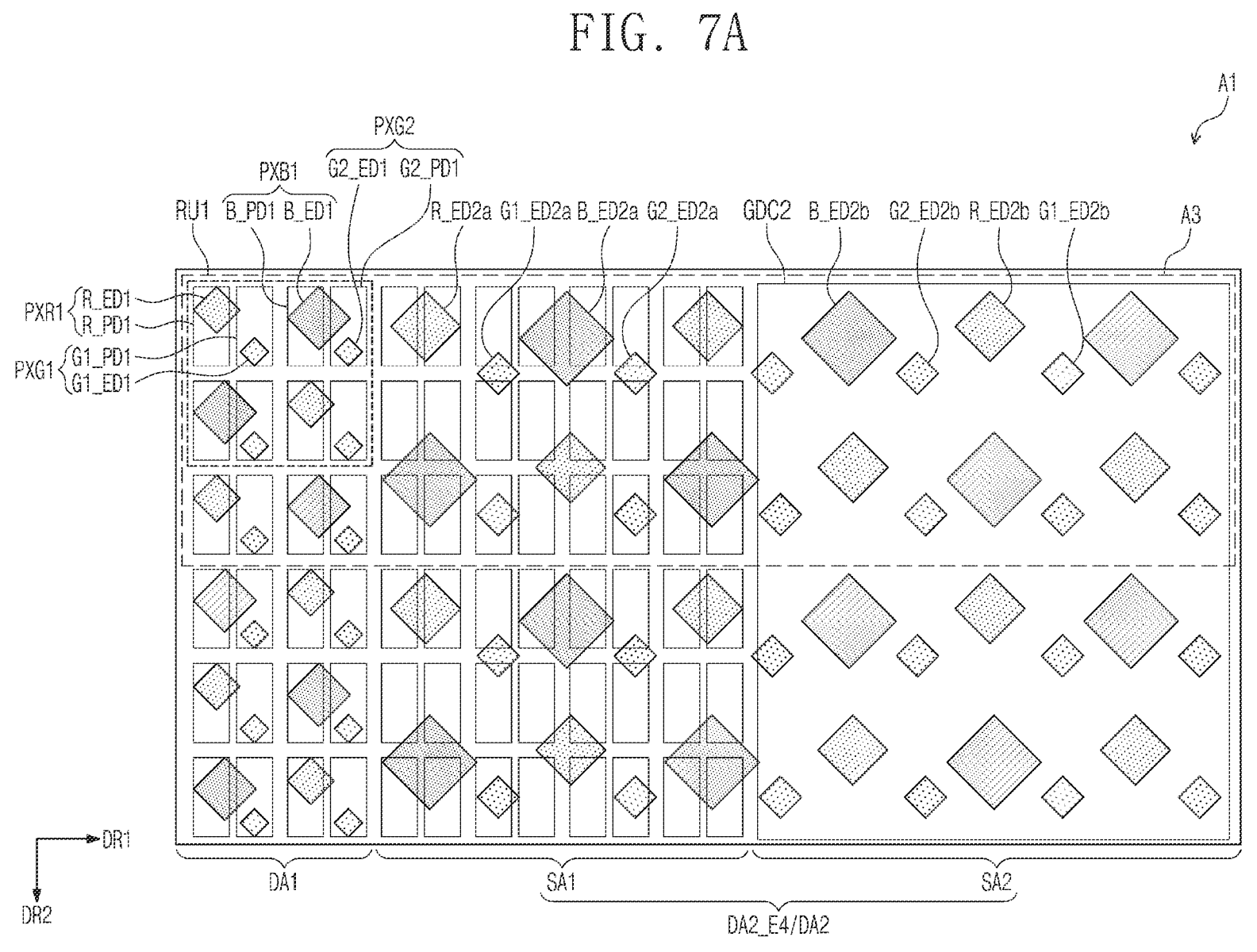

A1
A3
G1_ED2b
R_ED2b
G2_ED2b
B_ED2b
GDC2
G2_ED2a
B_ED2a
G1_ED2a
R_ED2a
PXG2
G2_ED1
G2_PD1
PXB1
B_PD1
B_ED1
RU1
PXR1
R_ED1
R_PD1
PXG1
G1_PD1
G1_ED1
SA2
SA1
DA2_E4/DA2
DA1
DR1
DR2

DISPLAY DEVICE

CROSS-REFERENCE TO RELATED APPLICATION(S)

This U.S. non-provisional patent application claims priority to and benefits of Korean Patent Application No. 10-2021-0185798 under 35 U.S.C. § 119, filed on Dec. 23, 2021 in the Korean Intellectual Property Office (KIPO), the entire contents of which are incorporated herein by reference.

BACKGROUND

1. Technical Field

The disclosure relates to a display device having an expanded display area.

2. Description of the Related Art

Various electronic devices that may be applied to multimedia devices, such as television sets, mobile phones, tablet computers, navigation units, or game units, are being developed.

In recent years, research is being carried out to reduce an area in which no image is displayed in the electronic devices in line with market needs. Research to expand an area through which an image is provided to a user in electronic devices is being carried out at the same time.

SUMMARY

The disclosure provides a display device having an expanded display area by reducing a width of a bezel area.

Embodiments of the disclosure provide a display device that may include a display panel including a first display area, and a second display area adjacent to the first display area, and a panel driver overlapping the second display area of the display panel. The display panel may include light emitting reference units each including light emitting elements and being disposed in the second display area, and driving reference units each including driving circuits and being electrically connected to a corresponding light emitting reference unit among the light emitting reference units. An arrangement order of the light emitting reference units may be different from an arrangement order of the driving reference units corresponding to the light emitting reference units.

The second display area may include a first sub-area adjacent to the first display area, and a second sub-area overlapping the panel driver. The first sub-area may be disposed between the second sub-area and the first display area.

The light emitting reference units may include first light emitting reference units overlapping the first sub-area, and second light emitting reference units overlapping the second sub-area. The driving reference units may be disposed in the first sub-area.

The driving reference units may include first driving reference units electrically connected to the first light emitting reference units, and second driving reference units electrically connected to the second light emitting reference units. The first driving reference units may be alternately arranged with the second driving reference units.

Each of the first driving reference units may overlap a corresponding first light emitting reference unit electrically connected thereto among the first light emitting reference units, and each of the second driving reference units may not overlap a corresponding second light emitting reference unit electrically connected thereto among the second light emitting reference units.

The display panel may further include a first group of routing lines electrically connecting the first light emitting reference units to the first driving reference units, and a second group of routing lines electrically connecting the second light emitting reference units to the second driving reference units. The routing lines of the first group may have a length shorter than a length of the routing lines of the second group.

Each of the light emitting elements may be driven by a corresponding driving circuit of the driving circuits.

A number of the light emitting elements may be greater than a number of the driving circuits.

The number of the light emitting elements may be two, three, or four times of the number of the driving circuits.

In case that the number of the light emitting elements is two times of the number of the driving circuits, each of the light emitting reference units may overlap two driving reference units, each of the light emitting reference units may be electrically connected to a first driving reference unit of the two driving reference units and may not be electrically connected to a second driving reference unit of the two driving reference units, and the first driving reference unit may be alternately arranged with the second driving reference unit.

In case that the number of the light emitting elements is three times of the number of the driving circuits, each of the light emitting reference units may overlap three driving reference units, each of the light emitting reference units may be electrically connected to a first driving reference unit of the three driving reference units and may not be electrically connected to second and third driving reference units of the three driving reference units, and the first, second, and third driving reference units may be alternately arranged with each other.

The light emitting elements may include first color light emitting elements emitting a first color light, second color light emitting elements emitting a second color light, and third color light emitting elements emitting a third color light.

A number of the second color light emitting elements may be greater than a number of the first color light emitting elements in each of the light emitting reference units.

The driving circuits may include a first driving circuit electrically connected to the first color light emitting elements, a second driving circuit electrically connected to the second color light emitting elements, and a third driving circuit electrically connected to the third color light emitting elements.

The second driving circuit may include a first sub-driving circuit electrically connected to a first group among the second color light emitting elements, and a second sub-driving circuit electrically connected to a second group among the second color light emitting elements.

The display panel may further include a first connection line electrically connecting the first color light emitting elements, a first sub-connection line electrically connecting the second color light emitting elements of the first group, a second sub-connection line electrically connecting the second color light emitting elements of the second group, and a third connection line electrically connecting the third color light emitting elements.

Each of the first, second, and third color light emitting elements may include a first electrode, a light emitting layer, and a second electrode. The first and third connection lines and the first and second sub-connection lines and the first electrode may be disposed on a same layer.

The display panel may further include a first routing line electrically connecting one of the first color light emitting elements to the first driving circuit, a first sub-routing line electrically connecting one of the second color light emitting elements of the first group to the first sub-driving circuit, a second sub-routing line electrically connecting one of the second color light emitting elements of the second group to the second sub-driving circuit, and a third routing line electrically connecting one of the third color light emitting elements to the third driving circuit.

The first routing line, the first and second sub-routing lines, and the third routing line may include a transparent conductive material.

Embodiments of the disclosure provide a display device that may include a display panel including a first display area, and a second display area adjacent to the first display area, and a panel driver driving the display panel. The second display area may include a first sub-area adjacent to the first display area, and a second sub-area overlapping the panel driver. The display panel may further include first light emitting elements disposed in the first sub-area, second light emitting elements disposed in the second sub-area, first pixel driving circuits disposed in the first sub-area and electrically connected to each of the first light emitting elements, and second pixel driving circuits disposed in the first sub-area and electrically connected to each of the second light emitting elements. Each of the first light emitting elements may overlap a corresponding first pixel driving circuit electrically connected thereto, and each of the second light emitting elements may be disposed not to overlap a corresponding second pixel driving circuit electrically connected thereto.

The first pixel driving circuits may be alternately arranged with the second pixel driving circuits in the first sub-area.

The display panel further include first routing lines electrically connecting the first light emitting elements to the first pixel driving circuits, and second routing lines electrically connecting the second light emitting elements to the second pixel driving circuits.

The display panel may further include reference light emitting elements disposed in the first display area. Each of the first and second light emitting elements may have a size greater than a size of a reference light emitting element among the reference light emitting elements, and the reference light emitting element and the first and second light emitting elements may emit a same color.

According to the above, an arrangement order of the first light emitting reference units overlapping the first sub-area and the second light emitting reference units overlapping the second sub-area may be different from an arrangement order of the first driving reference units connected to the first light emitting reference units and the second driving reference units connected to the second light emitting reference units. Thus, a length of routing lines or the number of the routing lines may decrease. As a result, a limitation in additionally arranging the light emitting elements may be solved, which may be caused by a narrow arrangement area for the routing lines, and thus, the second display area of the display device is able to be further expanded.

BRIEF DESCRIPTION OF THE DRAWINGS

The above and other advantages of the disclosure will become readily apparent by referring to the following detailed description when considered in conjunction with the accompanying drawings wherein:

FIGS. 6A and 6B are schematic conceptual views showing a connection relation between light emitting reference units and driving reference units according to an embodiment of the disclosure;

FIG. 7A is an enlarged schematic plan view showing an area shown in FIG. 3A according to an embodiment of the disclosure;

FIG. 8A is a schematic cross-sectional view of a display panel taken along line I-I' shown in FIG. 3A; and FIG. 8B is a schematic cross-sectional view of a display panel according to an embodiment of the disclosure.

DETAILED DESCRIPTION OF THE EMBODIMENTS

Figure 1:
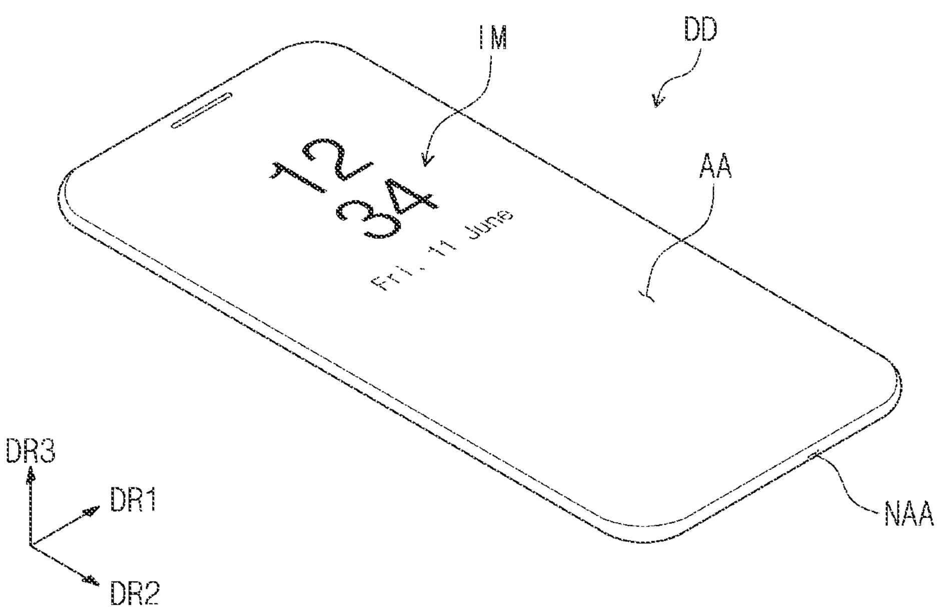
FIG. 1 is a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content. As used herein, the term "and/or" may include any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element or feature (e.g., as shown in the figures).

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

It will be understood that the terms "connected to" or "coupled to" may include a physical or electrical connection or coupling.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display device DD according to an embodiment of the disclosure.

FIG. 1 shows a smartphone as a representative example of the display device DD, however, the display device DD should not be limited to a smartphone. For example, the display device DD may be applied to a large-sized electronic item, such as a television set, a monitor, or the like, and a small and medium-sized electronic item, such as a tablet computer, a car navigation unit, a game unit, a smart watch, or the like.

The display device DD may include an active area AA in which an image IM may be displayed and a peripheral area NAA in which the image IM may not be displayed. In FIG. 1, as an example of the image IM, date and time images are shown.

The active area AA may have a shape substantially parallel to a plane defined by a first direction DR1 and a second direction DR2, however, the disclosure should not be limited thereto or thereby. According to an embodiment, the active area AA may be curved at an area. A normal line direction of the active area AA, i.e., a thickness direction of the display device DD, may be substantially parallel to a third direction DR3. The first, second, and third directions DR1, DR2, and DR3 may be relative to each other and may be changed to other directions. The peripheral area NAA may be an area in which the image IM may not be displayed. A bezel area may be defined in the display device DD by the peripheral area NAA.

Figure 2A:
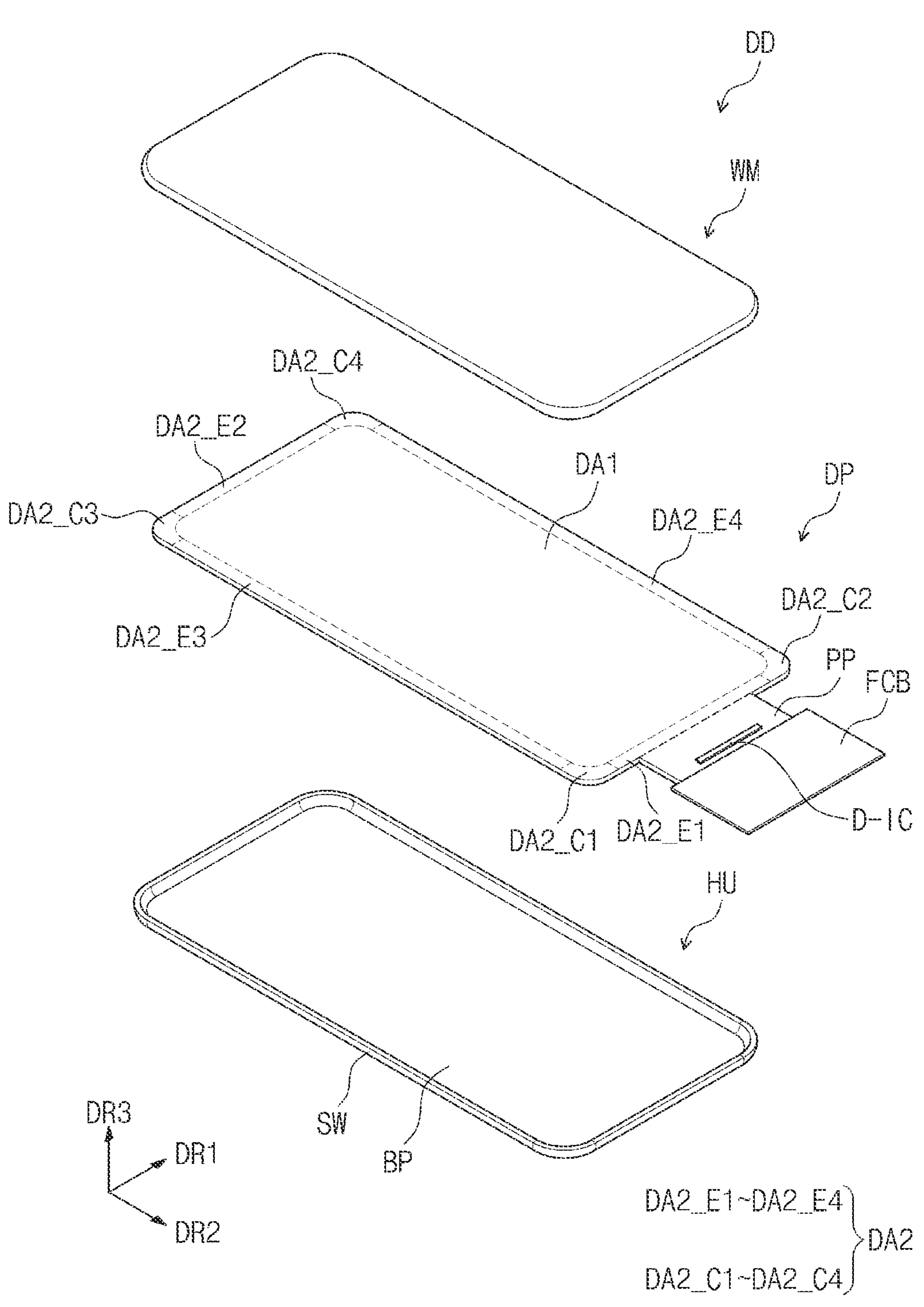
FIG. 2A is an exploded schematic perspective view showing a display device according to an embodiment of the disclosure.
Figure 2B:
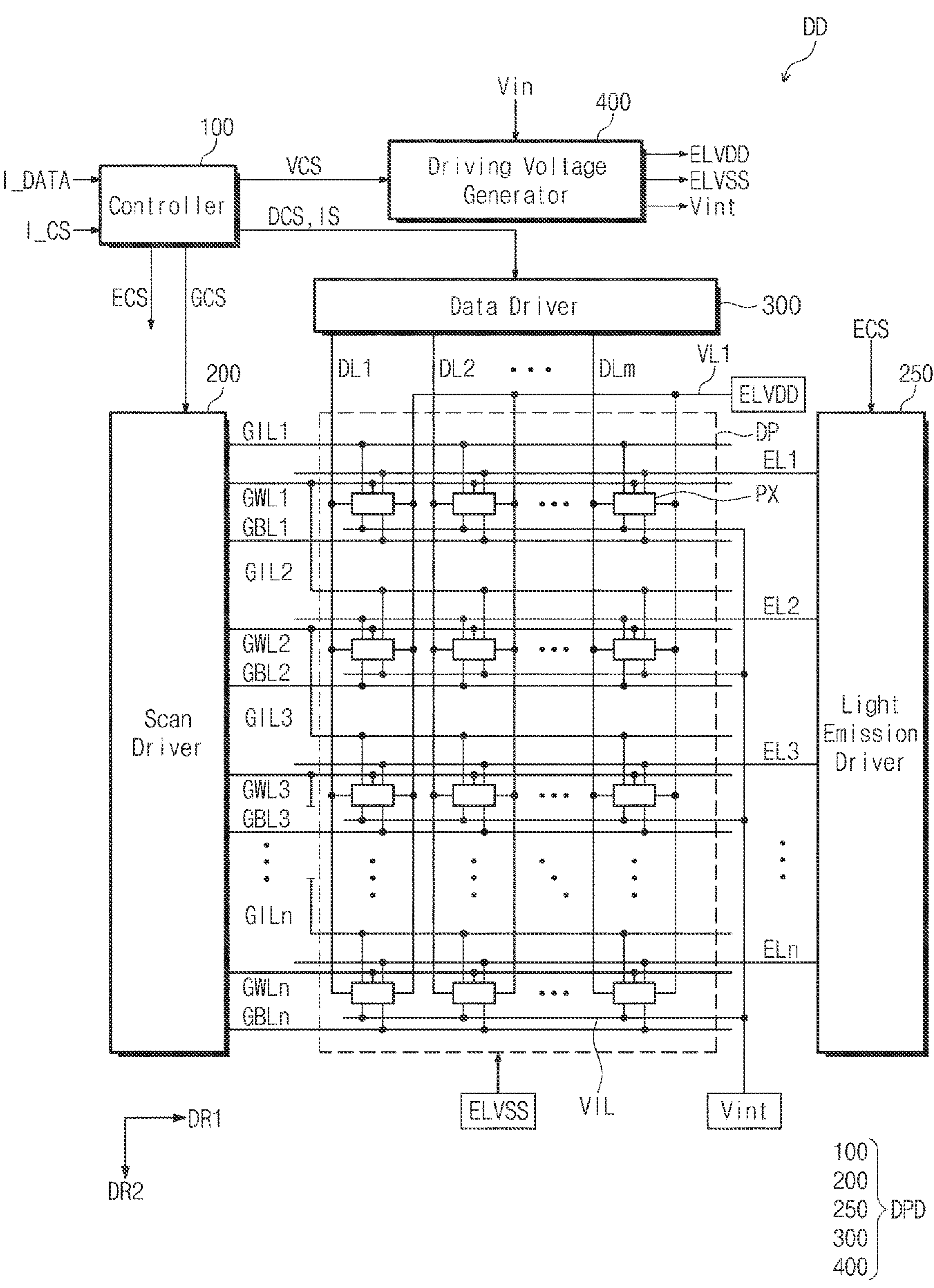
FIG. 2B is a schematic block diagram showing a display device according to an embodiment of the disclosure.
Figure 3A:
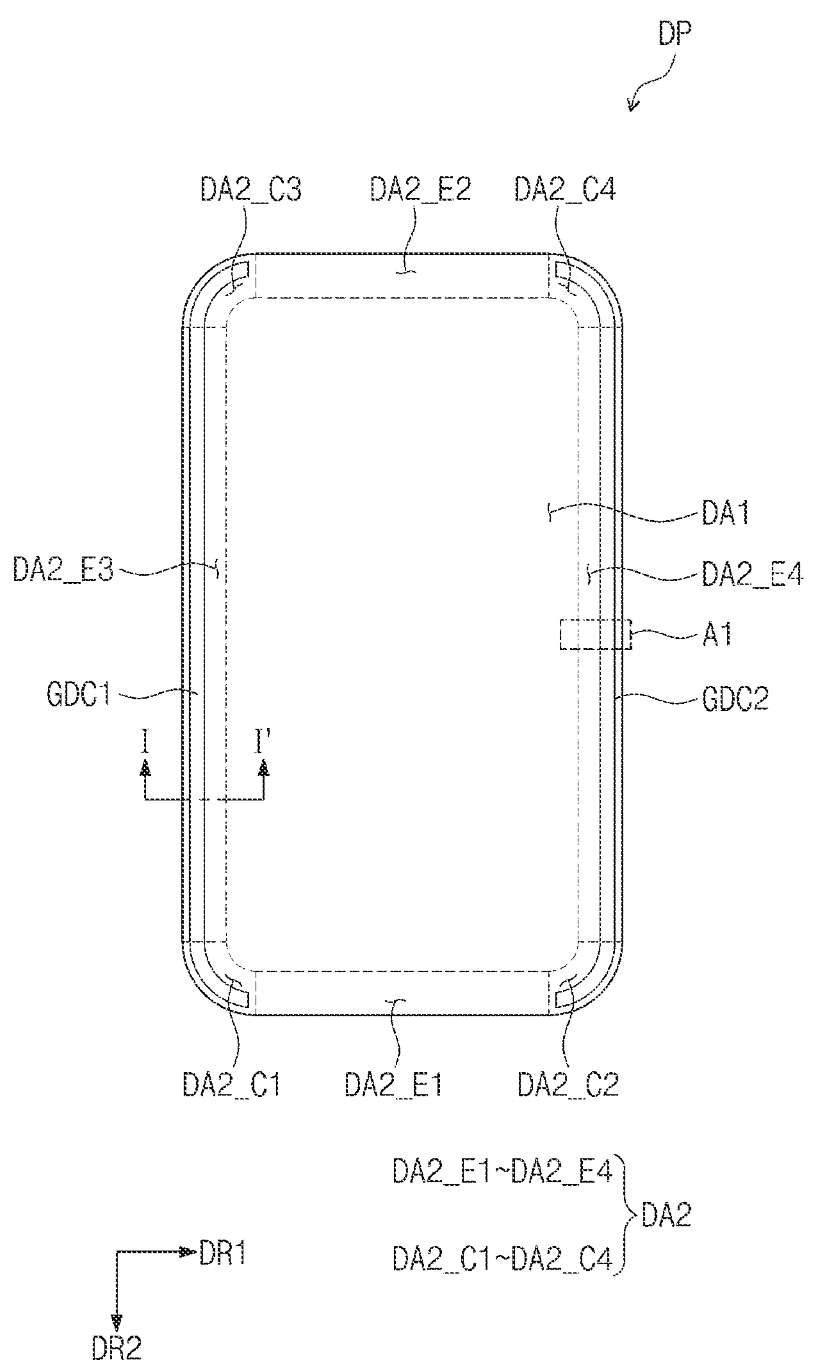
FIGS. 3A and 3B are schematic plan views showing a display panel according to an embodiment of the disclosure.
Figure 3B:
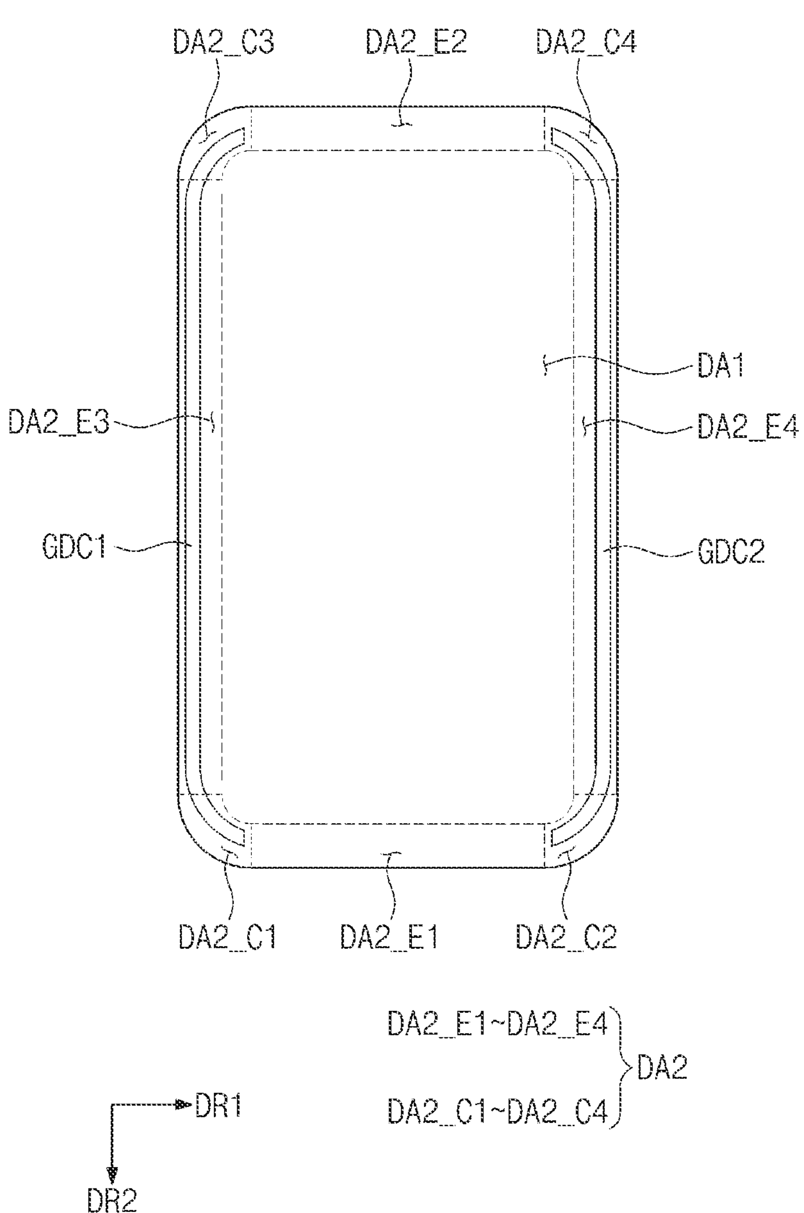

FIG. 2A is an exploded schematic perspective view showing the display device DD according to an embodiment of the disclosure. FIG. 2B is a schematic block diagram showing the display device DD according to an embodiment of the disclosure. FIGS. 3A and 3B are schematic plan views showing the display panel according to an embodiment of the disclosure.

Referring to FIG. 2A, the display device DD may include a window WM, a display panel DP, and a housing HU. The window WM may protect an upper surface of the display panel DP. The window WM may be optically transparent. Accordingly, the image displayed through the display panel DP may be viewed by a user through the window WM. For example, a display surface of the display device DD may be defined by the window WM. The window WM may be implemented by a glass, plastic, or film.

Referring to FIGS. 2A and 3A, the display panel DP may include a display area displaying the image. The display area may correspond to the active area AA of FIG. 1. As an example, the display area may include a first display area DA1 and a second display area DA2. The first display area DA1 may have a quadrangular shape with four sides. As an example, the first display area DA1 may have a shape with four rounded corners.

The second display area DA2 may include first, second, third, and fourth edge display areas DA2_E1, DA2_E2, DA2_E3, and DA2_E4. The first and second edge display areas DA2_E1 and DA2_E2 may respectively extend from first and second sides of the first display area DA1. The first and second sides of the first display area DA1 may extend parallel to the first direction DR1. The first and second edge display areas DA2_E1 and DA2_E2 may be formed parallel to the first display area DA1, however, the disclosure should not be limited thereto or thereby. According to an embodiment, the first and second edge display areas DA2_E1 and DA2_E2 may be curved from the first display area DA1 at a curvature.

The third and fourth edge display areas DA2_E3 and DA2_E4 may respectively extend from third and fourth sides of the first display area DA1. The third and fourth sides of the first display area DA1 may extend parallel to the second direction DR2. The third and fourth edge display areas DA2_E3 and DA2_E4 may be formed parallel to the first display area DA1, however, the disclosure should not be limited thereto or thereby. The third and fourth edge display areas DA2_E3 and DA2_E4 may be curved from the first display area DA1 at a curvature.

The structure of the display panel DP in which the second display area DA2 includes the four edge display areas DA2_E1 to DA2_E4 is described with reference to FIGS. 2A and 3A, however, the structure of the display panel DP according to the disclosure should not be limited thereto or thereby. According to an embodiment, the second display area DA2 of the display panel DP may include only one edge display area or may include only two edge display areas that may be provided at the first and second sides of the first display area DA1 or at the third and fourth sides of the first display area DA1.

The second display area DA2 may further include first, second, third, and fourth corner display areas DA2_C1, DA2_C2, DA2_C3, and DA2_C4. The first corner display area DA2_C1 may be disposed between the first and third edge display areas DA2_E1 and DA2_E3, and the second corner display area DA2_C2 may be disposed between the first and fourth edge display areas DA2_E1 and DA2_E4. In addition, the third corner display area DA2_C3 may be disposed between the second and third edge display areas DA2_E2 and DA2_E3, and the fourth corner display area DA2_C4 may be disposed between the second and fourth edge display areas DA2_E2 and DA2_E4. The first to fourth corner display areas DA2_C1 to DA2_C4 may be areas in which the image may be displayed, however, the disclosure should not be limited thereto or thereby. For example, the first to fourth corner display areas DA2_C1 to DA2_C4 may be areas in which no image may be displayed, or only a portion of the first to fourth corner display areas DA2_C1 to DA2_C4 may display the image.

The display panel DP according to an embodiment of the disclosure may be a light-emitting type display panel, however, embodiments should not be particularly limited. For instance, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot and a quantum rod.

The display panel DP may be a flexible display panel. Accordingly, the display panel DP may be entirely rolled or may be folded or unfolded about a folding axis.

The display device DD may further include an input sensing layer to sense an external input, e.g., a touch event. The input sensing layer may be disposed directly on the display panel DP. According to an embodiment, the input sensing layer may be formed on the display panel DP through successive processes. For example, in case that the input sensing layer is disposed directly on the display panel DP, an adhesive film may not be disposed between the input sensing layer and the display panel, however, the disclosure should not be limited thereto or thereby. As an example, an adhesive film may be disposed between the input sensing layer and the display panel DP. The input sensing layer may not be manufactured together with the display panel DP through the successive processes and may be fixed to the upper surface of the display panel DP by the adhesive film after being manufactured through a separate process.

Referring to FIG. 2B, the display device DD may further include a panel driver DPD to drive the display panel DP. As an example, the panel driver DPD may include a controller 100, a scan driver 200, a light emission driver 250, a data driver 300, and a driving voltage generator 400.

The controller 100 may receive image data I_DATA and an input control signal I_CS and may convert a data format of the image data I_DATA to a data format appropriate to an interface between the controller 100 and the data driver 300 to generate an image signal IS. The controller 100 may convert the input control signal I_CS into various control signals DCS, GCS, and VCS and may output the control signals DCS, GCS, and VCS.

The scan driver 200 may receive a scan control signal GCS from the controller 100. The scan control signal GCS may include a vertical start signal that starts an operation of the scan driver 200 and a clock signal that determines an output timing of signals. The scan driver 200 may generate scan signals and may sequentially output the scan signals to scan lines GIL1 to GILn, GWL1 to GWLn, and GBL1 to GBLn, which will be described later.

The light emission driver 250 may receive an emission driving signal ECS from the controller 100. The light emission driver 250 may generate emission control signals in response to the emission driving signal ECS and may output the emission control signals to emission control lines EL1 to ELn, which will be described later.

In FIG. 2B, the scan driver 200 and the light emission driver 250 may be provided to the display device DD as independent components, however, the disclosure should not be limited thereto or thereby. As an example, the scan driver 200 and light emission driver 250 may be provided to the display device DD in an integrated configuration.

The data driver 300 may receive a data control signal DCS and the image signal IS from the controller 100. The data driver 300 may convert the image signal IS to a data signal and may output the data signal to data lines DL1 to DLm described later. The data signal may be an analog voltage corresponding to a grayscale value of the image signal IS.

The driving voltage generator 400 may receive a power source voltage Vin from a power supply (not shown). The driving voltage generator 400 may convert the source voltage Vin to generate a first driving voltage ELVDD and a second driving voltage ELVSS having a voltage level different from that of the first driving voltage ELVDD. The driving voltage generator 400 may include a DC-DC converter. The driving voltage generator 400 may include a boosting converter that boosts the power source voltage Vin and generates the first driving voltage ELVDD. In addition, the driving voltage generator 400 may include a buck converter that steps down the power source voltage Vin and generates the second driving voltage ELVSS. The driving voltage generator 400 may receive a driving voltage control signal VCS from the controller 100. The driving voltage generator 400 may generate the first and second driving voltages ELVDD and ELVSS in response to the driving voltage control signal VCS.

The driving voltage generator 400 may further generate an initialization voltage Vint. The initialization voltage Vint may have a voltage level different from those of the first and second driving voltages ELVDD and ELVSS.

The display panel DP may include the scan lines GIL1 to GILn, GWL1 to GWLn, and GBL1 to GBLn, the emission control lines EL1 to ELn, the data lines DL1 to DLm, and pixels PX. The scan lines GIL1 to GILn, GWL1 to GWLn, and GBL1 to GBLn may extend in the first direction DR1 and may be arranged in the second direction DR2 perpendicular to the first direction DR1. Each of the emission control lines EL1 to ELn may be arranged parallel to a corresponding scan line among the scan lines GIL1 to GILn, GWL1 to GWLn, and GBL1 to GBLn. The data lines DL1 to DLm may be insulated from the scan lines GIL1 to GILn, GWL1 to GWLn, and GBL1 to GBLn while crossing the scan lines GILL to GILn, GWL1 to GWLn, and GBL1 to GBLn.

Each of the pixels PX may be connected to corresponding scan lines among the scan lines GIL1 to GILn, GWL1 to GWLn, and GBL1 to GBLn, a corresponding emission control line among the emission control lines EL1 to ELn, and corresponding data lines among the data lines DL1 to DLm. FIG. 2B shows a structure in which each of the pixels PX may be connected to three scan lines among the scan lines GIL1 to GILn, GWL1 to GWLn, and GBL1 to GBLn, however, the disclosure should not be limited thereto or thereby. For example, each pixel PX may be connected to two scan lines among the scan lines GIL1 to GILn, GWL1 to GWLn, and GBL1 to GBLn.

The display panel DP may receive the first driving voltage ELVDD and the second driving voltage ELVSS. The first driving voltage ELVDD may be applied to the pixels PX via a first source voltage line VL1. The second driving voltage ELVSS may be applied to the pixels PX via electrodes (not shown) formed in the display panel DP or a second source voltage line. The display panel DP may receive the initialization voltage Vint. The initialization voltage Vint may be applied to the pixels PX via an initialization voltage line VIL.

Referring to FIGS. 2B, 3A, and 3B, the scan driver 200 may include a first scan driver GDC1 and a second scan driver GDC2. Each of the first and second scan drivers GDC1 and GDC2 may generate the scan signals and may output the generated signals to corresponding pixels. The first and second scan drivers GDC1 and GDC2 may be built in the display panel DP. The expression "a component may be built in the display panel DP" as used herein may mean that the component may be formed directly in the display panel DP through a thin film process of forming the pixels PX in the display panel DP.

The display panel DP may further include a non-display area around the second display area DA2. The non-display area may be an area in which the image may not be displayed. The non-display area may surround the second display area DA2.

Each of the first and second scan drivers GDC1 and GDC2 may be disposed in the second display area DA2 or may be disposed to partially overlap the second display area DA2. As each of the first and second scan drivers GDC1 and GDC2 may be disposed in the second display area DA2, an increase in width of the non-display area in the display device DD due to the first and second scan drivers GDC1 and GDC2 may be prevented. Consequently, the area in which the first and second scan drivers GDC1 and GDC2 may be disposed may be implemented as the second display area DA2, and thus, the size of the non-display area, which may be perceived by the user, in the display device DD may be reduced.

In FIG. 3A, the first scan driver GDC1 may be disposed adjacent to an outer side of the third edge display area DA2_E3, and the second scan driver GDC2 may be disposed adjacent to an outer side of the fourth edge display area DA2_E4. The first scan driver GDC1 may be disposed adjacent to outer sides of the first and third corner display areas DA2_C1 and DA2_C3, and the second scan driver GDC2 may be disposed adjacent to outer sides of the second and fourth corner display areas DA2_C2 and DA2_C4. However, locations of the first and second scan drivers GDC1 and GDC2 should not be limited thereto or thereby.

As shown in FIG. 3B, the first scan driver GDC1 may be disposed adjacent to a boundary between the first display area DA1 and the first and third corner areas DA2_C1 and DA2_C3 in the first and third corner areas DA2_C1 and DA2_C3, and the second scan driver GDC2 may be disposed adjacent to a boundary between the first display area DA1 and the second and fourth corner areas DA2_C2 and DA2_C4 in the second and fourth corner areas DA2_C2 and DA2_C4. In the first to fourth corner display areas DA2_C1 to DA2_C4, a bending stress may increase as it gets closer to the outside with respect to the first display area DA1. In case that the first and second scan drivers GDC1 and GDC2 are disposed adjacent to the outer side in the first to fourth corner display areas DA2_C1 to DA2_C4, the bending stress may affect an operation of the first and second scan drivers GDC1 and GDC2. Accordingly, as the first and second scan drivers GDC1 and GDC2 may be disposed adjacent to the first display area DA1 in the first to fourth corner display areas DA2_C1 to DA2_C4, a deterioration in reliability of the first and second scan drivers GDC1 and GDC2, which may be caused by the bending stress, may be prevented.

In an embodiment of the disclosure, the first image displayed in the first display area DA1 and the second image displayed in the second display area DA2 may be dependent on each other. As an example, a picture, a scene in a movie, or a UX/UI design may be formed by the combination of the first image and the second image, however, the disclosure should not be limited thereto or thereby. For example, a portion of the second display area DA2, e.g., the first to fourth corner display areas DA2_C1 to DA2_C4, may display a black image or an image having a certain pattern, which may not be dependent on the first image.

As an example, the display panel DP may be an organic light emitting display panel, an electrophoretic display panel, or an electrowetting display panel. The display panel DP may be a flexible display panel that may be bent along a shape of the window WM.

Referring to FIG. 2A again, the display panel DP may further include a pad area PP extending from the second display area DA2. A driving chip D-IC and pads may be disposed in the pad area PP of the display panel DP. The driving chip D-IC may include the data driver 300 (refer to FIG. 2B). The driving chip D-IC in which the data driver 300 may be built may apply the data signal to the first and second display areas DA1 and DA2 of the display panel DP. The driving chip D-IC may further include the driving voltage generator 400 (refer to FIG. 2B). The driving chip D-IC may supply the first and second driving voltages ELVDD and ELVSS and the initialization voltage Vint to the first and second display areas DA1 and DA2.

As an example, the driving chip D-IC may be mounted on the display panel DP. The display panel DP may be electrically connected to a flexible circuit film FCB via the pads. According to an embodiment of the disclosure, the driving chip D-IC may be mounted on the flexible circuit film FCB.

The housing HU may include a bottom portion BP and a sidewall SW. The sidewall SW may extend from the bottom portion BP. The display panel DP may be accommodated in an accommodating space defined by the bottom portion BP and the sidewall SW in the housing HU. The window WM may be coupled to the sidewall SW of the housing HU. The sidewall SW of the housing HU may support an edge of the window WM.

The housing HU may include a material having a relatively high strength. As an example, the housing HU may include a glass, plastic, or metal material or multiple frames and/or plates formed by a combination of the glass, plastic, and metal materials. The housing HU may stably protect components of the display device DD accommodated therein from external impacts.

Figure 4A:
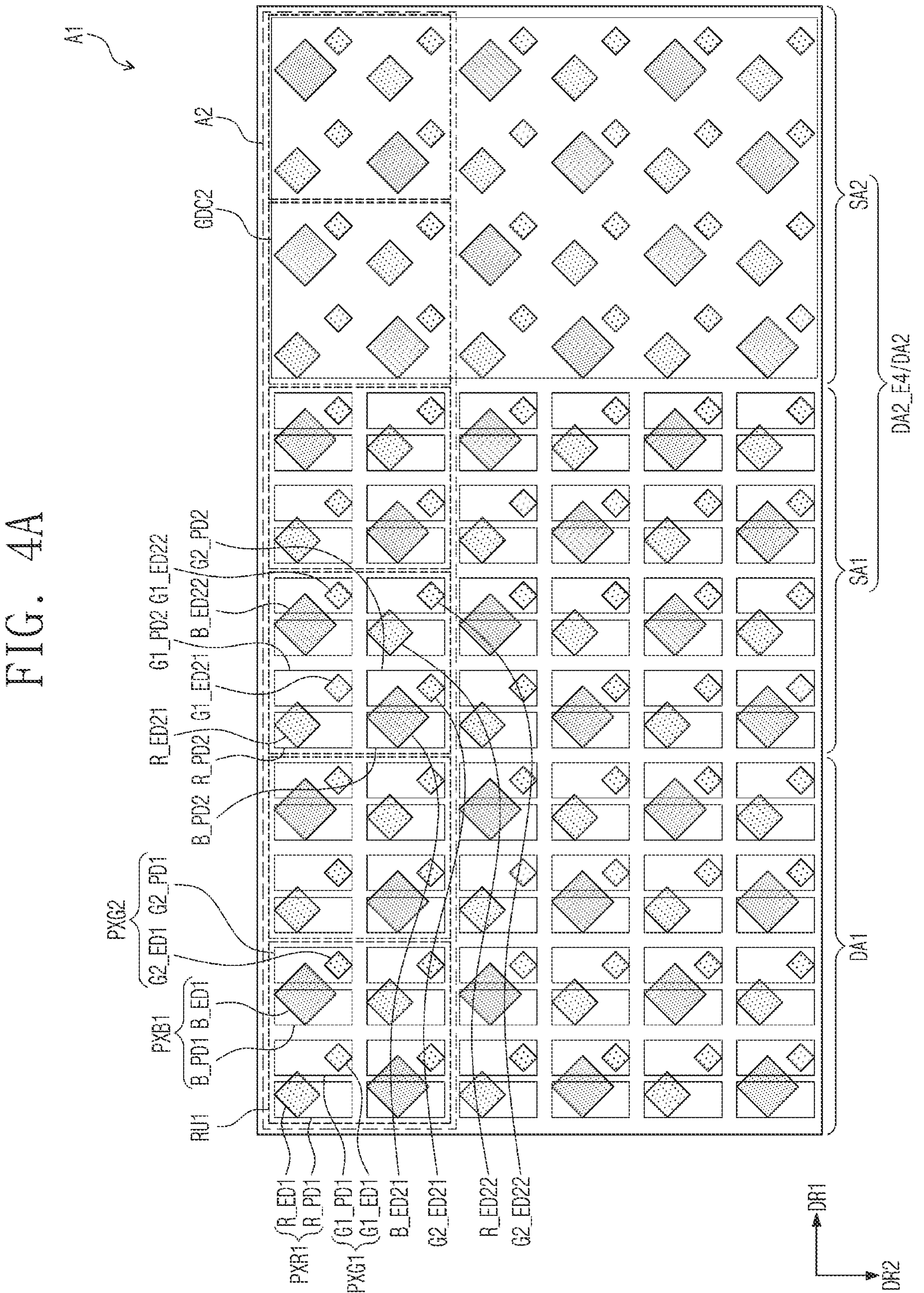
FIG. 4A is an enlarged schematic plan view showing an area shown in FIG. 3A according to an embodiment of the disclosure.
Figure 4B:
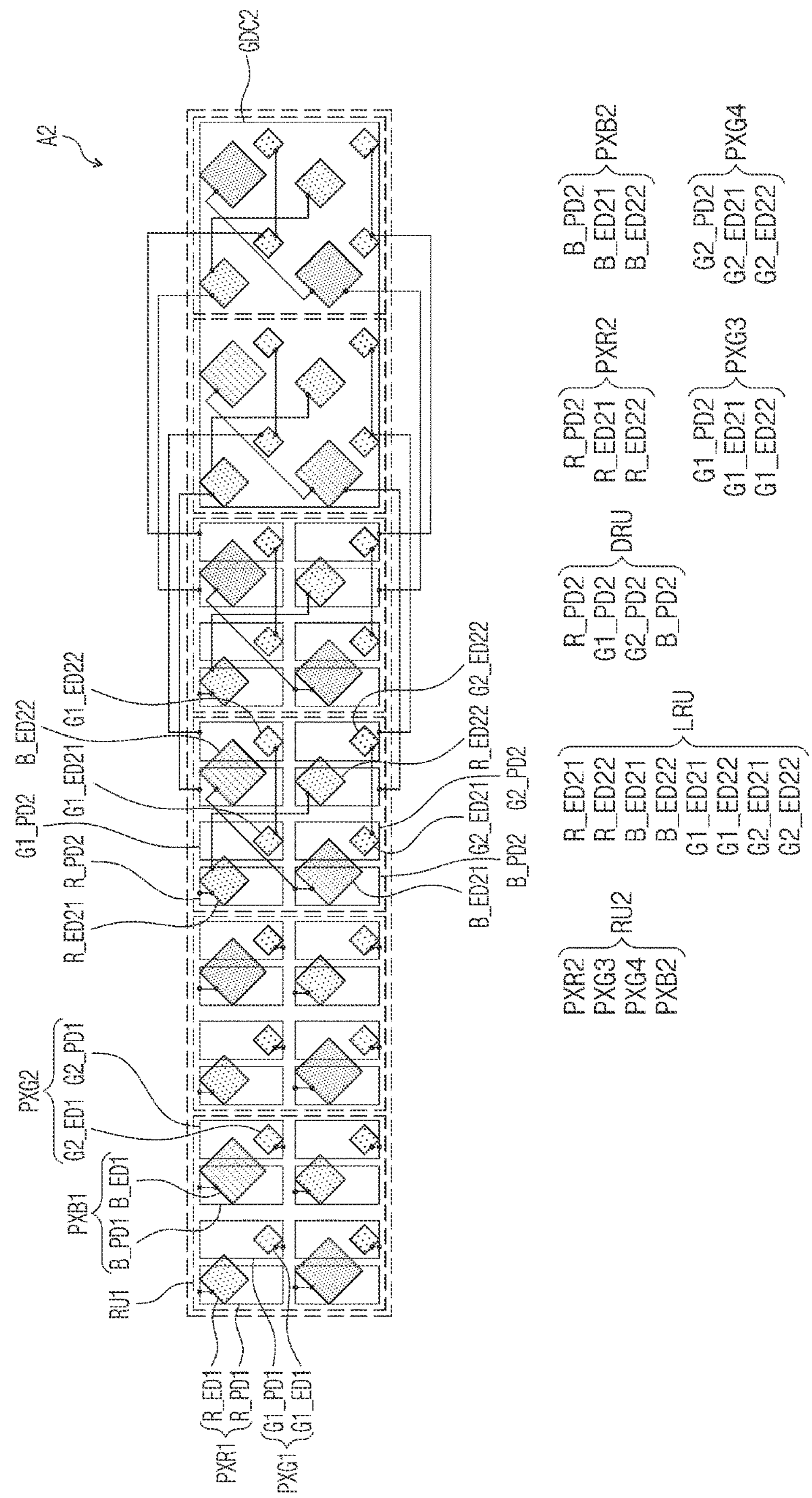
FIG. 4B is a schematic conceptual view showing a connection relation between light emitting elements and driving circuits of an area shown in FIG. 3A.
Figure 4C:
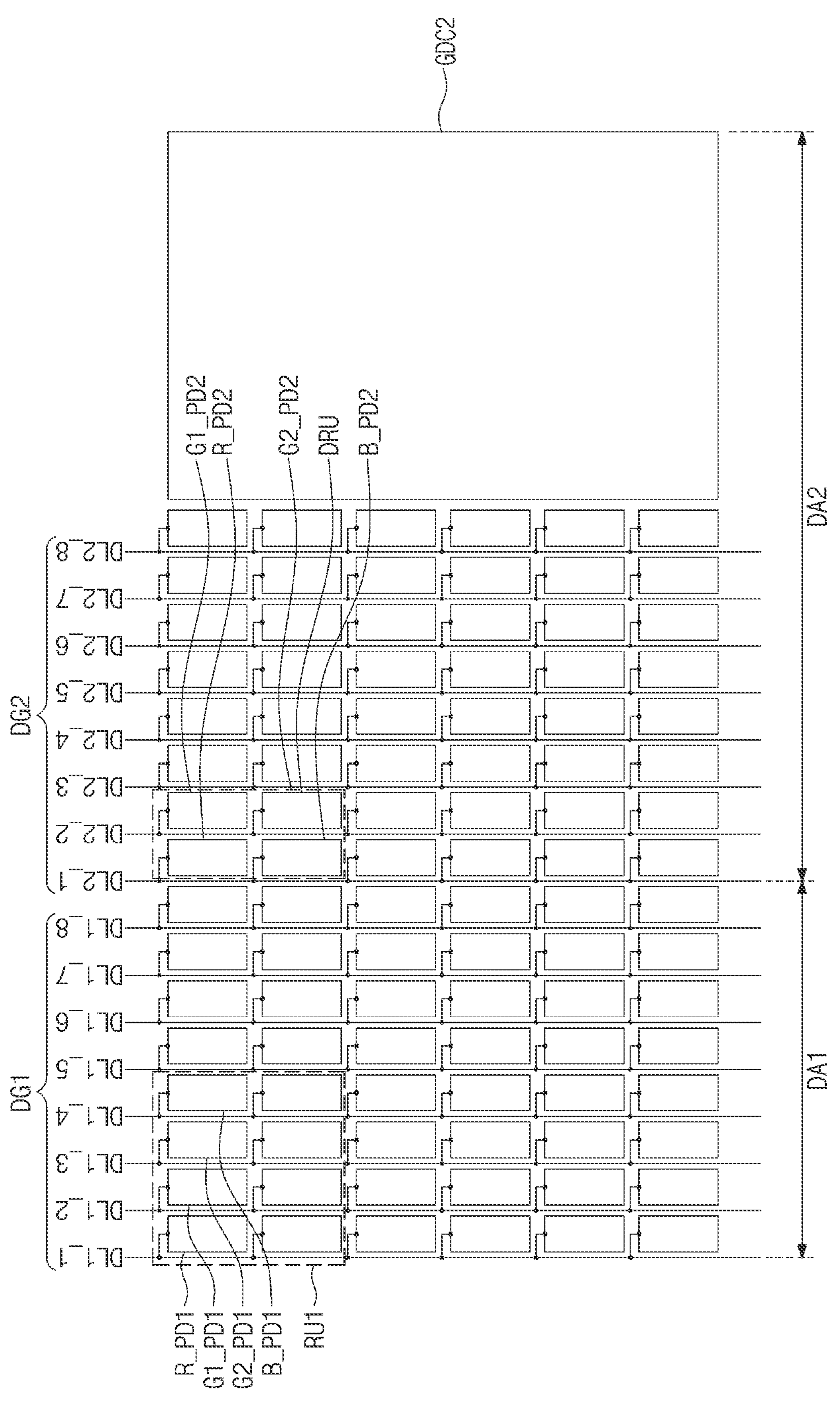
FIG. 4C is a schematic conceptual view showing a connection relation between driving circuits shown in FIG. 4A and data lines.

FIG. 4A is an enlarged schematic plan view showing an area A1 shown in FIG. 3A according to an embodiment of the disclosure. FIG. 4B is a schematic conceptual view showing a connection relation between light emitting elements and driving circuits of an area A2 shown in FIG. 3A. FIG. 4C is a schematic conceptual view showing a connection relation between driving circuits shown in FIG. 4A and data lines.

Referring to FIGS. 4A and 4B, multiple first reference units RU1 may be repeatedly arranged in the first and second directions DR1 and DR2 in the first display area DA1 of the display panel DP. Each of the first reference units RU1 may include multiple pixels. As an example, each of the first reference units RU1 may include p red pixels, q green pixels, and p blue pixels. Each of p and q may be a natural number equal to or greater than 1, and q may be greater than p.

For the convenience of explanation, a red pixel included in each of the first reference units RU1 will be referred to as a first red pixel PXR1, and a blue pixel included in each of the first reference units RU1 will be referred to as a first blue pixel PXB1. A green pixel adjacent to the first red pixel PXR1 among green pixels included in each of the first reference units RU1 will be referred to as a first green pixel PXG1, and a green pixel adjacent to the first blue pixel PXB1 among the green pixels included in each of the first reference units RU1 will be referred to as a second green pixel PXG2. As an example, q may be equal to 2p. As an example, p may be 2, and q may be 4.

As shown in FIGS. 4A and 4B, each of the first reference units RU1 may include two first red pixels PXR1, two first blue pixels PXB1, two first green pixels PXG1, and two second green pixels PXG2. However, the number of the pixels included in the first reference units RU1 should not be particularly limited.

The first red pixel PXR1 may include a first red driving circuit R_PD1 and a first red light emitting element R_ED1. The first red driving circuit R_PD1 may be electrically connected to a corresponding first red light emitting element R_ED1 to control a drive of the first red light emitting element R_ED1. The first green pixel PXG1 may include a first green driving circuit G1_PD1 and a first green light emitting element G1_ED1. The first green driving circuit G1_PD1 may be electrically connected to a corresponding first green light emitting element G1_ED1 to control a drive of the first green light emitting element G1_ED1. The second green pixel PXG2 may include a second green driving circuit G2_PD1 and a second green light emitting element G2_ED1. The second green driving circuit G2_PD1 may be electrically connected to a corresponding second green light emitting element G2_ED1 to control a drive of the second green light emitting element G2_ED1. The first blue pixel PXB1 may include a first blue driving circuit B_PD1 and a first blue light emitting element B_ED1. The first blue driving circuit B_PD1 may be electrically connected to a corresponding first blue light emitting element B_ED1 to control a drive of the first blue light emitting element B_ED1. The first red light emitting element R_ED1 may emit a red light, the first and second green light emitting elements G1_ED1 and G2_ED2 may emit a green light, and the first blue light emitting element B_ED1 may emit a blue light.

The first red driving circuit R_PD1 may be disposed to overlap the first red light emitting element R_ED1 electrically connected thereto, and the first blue driving circuit B_PD1 may be disposed to overlap the first blue light emitting element B_ED1 electrically connected thereto. The first green driving circuit G1_PD1 may be disposed to overlap the first green light emitting element G1_ED1 electrically connected thereto, and the second green driving circuit G2_PD1 may be disposed to overlap the second green light emitting element G2_ED1 electrically connected thereto.

The fourth edge display area DA2_E4 of the second display area DA2 may include first and second sub-areas SA1 and SA2. FIGS. 4A and 4B show only the fourth edge display area DA2_E4 of the second display area DA2, however, at least one of the first to third edge display areas DA2_E1 to DA2_E3 and the first to fourth corner display areas DA2_C1 to DA2_C4 of the second display area DA2 may have a structure similar to that of the fourth edge display area DA2_E4. Accordingly, the fourth edge display area DA2_E4 will be described with reference to FIGS. 4A and 4B, and descriptions of the other areas of the second display area DA2 will be omitted. However, in the following descriptions with reference to FIGS. 4A and 4B, for the convenience of explanation, the fourth edge display area DA2_E4 will be referred to as the second display area DA2 that may be an umbrella term.

Second reference units RU2 may be repeatedly disposed in the first and second directions DR1 and DR2 in the second display area DA2 of the display panel DP. Each of the second reference units RU2 may include a second red pixel PXR2, a third green pixel PXG3, a fourth green pixel PXG4, and a second blue pixel PXB2. Each of the second reference units RU2 may include n second red light emitting elements R_ED21 and R_ED22, m green light emitting elements G1_ED21, G1_ED22, G2_ED21, and G2_ED22, and n second blue light emitting elements B_ED21 and B_ED22. Each of n and m may be a natural number equal to or greater than 1, and m may be greater than n. As an example, m may be 2n. As an example, n may be 2, and in this case, m may be 4.

The two second red light emitting elements R_ED21 and R_ED22 may be included in the second red pixel PXR2, and the two second blue light emitting elements B_ED21 and B_ED22 may be included in the second blue pixel PXR2. Some of the four green light emitting elements, for example, two green light emitting elements (hereinafter, referred to as third green light emitting elements G1_ED21 and G1_ED22) may be included in the third green pixel PXG3, and the other green light emitting elements of the four green light emitting elements, for example, two green light emitting elements (hereinafter, referred to as fourth green light emitting elements G2_ED21 and G2_ED22) may be included in the fourth green pixel PXG4.

The second red light emitting elements R_ED21 and R_ED22 may emit the red light, the second blue light emitting elements B_ED21 and B_ED22 may emit the blue light. The third green light emitting elements G1_ED21 and G1_ED22 and the fourth green light emitting elements G2_ED21 and G2_ED22 may emit the green light.

Each of light emitting reference units LRU may be configured to include multiple light emitting elements included in each of the second reference units RU2. As an example, each light emitting reference unit LRU may include two second red light emitting elements R_ED21 and R_ED22, two second blue light emitting elements B_ED21 and B_ED22, two third green light emitting elements G1_ED21 and G1_ED22, and two fourth green light emitting elements G2_ED21 and G2_ED22.

The second red pixel PXR2 may further include a second red driving circuit R_PD2 (or referred to as a first driving circuit). The second red driving circuit R_PD2 may be electrically connected to corresponding n second red light emitting elements R_ED21 and R_ED22 and may substantially simultaneously control a drive of the n second red light emitting elements R_ED21 and R_ED22. The third green pixel PXG3 may further include a third green driving circuit G1_PD2 (or referred to as a first sub-driving circuit). The third green driving circuit G1_PD2 may be electrically connected to corresponding n third green light emitting elements G1_ED21 and G1_ED22 and may substantially simultaneously control a drive of the n third green light emitting elements G1_ED21 and G1_ED22. The fourth green pixel PXG4 may further include a fourth green driving circuit G2_PD2 (or referred to as a second sub-driving circuit). The fourth green driving circuit G2_PD2 may be electrically connected to corresponding n fourth green light emitting elements G2_ED21 and G2_ED22 and may substantially simultaneously control a drive of the n fourth green light emitting elements G2_ED21 and G2_ED22. The second blue pixel PXB2 may further include a second blue driving circuit B_PD2 (or referred to as a third driving circuit). The second blue driving circuit B_PD2 may be electrically connected to corresponding n second blue light emitting elements B_ED21 and B_ED22 and may substantially simultaneously control a drive of the n second blue light emitting elements B_ED21 and B_ED22.

Each of the driving reference units DRU may include k driving circuits included in each of the second reference units RU2. In an embodiment, k may be a natural number equal to or greater than 1. According to an embodiment, the number of the light emitting elements included in each of the second reference units RU2 (e.g., 2n+m) may be greater than k. As an example, 2n+m may be two times, three times, or four times of k.

As an example, each driving reference unit DRU may include the second red driving circuit R_PD2, the third green driving circuit G1_PD2, the fourth green driving circuit G2_PD2, and the second blue driving circuit B_PD2.

As an example, n may be 2, and m may be 4, however, they should not be limited thereto or thereby. According to an embodiment, p may have the same value as n, q may have the same value as m, however, they should not be particularly limited.

Each of the second red light emitting elements R_ED21 and R_ED22 may have the same shape and the same size as those of the first red light emitting element R_ED1. The third green light emitting elements G1_ED21 and G1_ED22 and the fourth green light emitting elements G2_ED21 and G2_ED22 may have the same shape and the same size as those of the first green light emitting element G1_ED1 and/or the second green light emitting element G2_ED1, respectively. Each of the second blue light emitting elements B_ED21 and B_ED22 may have the same shape and the same size as those of the first blue light emitting element B_ED1.

The second display area DA2 may include a first sub-area SA1 and a second sub-area SA2. In detail, the fourth edge display area DA2_E4 of the second display area DA2 may be divided into the first sub-area SA1 and the second sub-area SA2. Although not shown in FIG. 4A, the third edge display area DA2_E3 (refer to FIG. 3A) of the second display area DA2 may also be divided into the first sub-area SA1 and the second sub-area SA2. The first sub-area SA1 may be disposed between the second sub-area SA2 and the first display area DA1.

The driving circuits R_PD2, G1_PD2, G2_PD2, and B_PD2 included in each of the second reference units RU2 may be disposed in the first sub-area SA1, and the first and second scan drivers GDC1 and GDC2 may be disposed in the second sub-area SA2. Accordingly, the driving circuits R_PD2, G1_PD2, G2_PD2, and B_PD2 may not overlap the second scan driver GDC2 (or the first scan driver GDC1). The light emitting elements included in each of the second reference units RU2 may be disposed in the first and second sub-areas SA1 and SA2.

Some of the light emitting reference units LRU may be disposed to overlap the first sub-area SA1, and the other of the light emitting reference units LRU may overlap the second sub-area SA2. Hereinafter, the some of the light emitting reference units LRU overlapping the first sub-area SA1 will be referred to as first light emitting reference units, and the other light emitting reference units LRU overlapping the second sub-area SA2 will be referred to as second light emitting reference units.

The first light emitting reference units may be disposed on the driving circuits R_PD2, G1_PD2, G2_PD2, and B_PD2, and the second light emitting reference units may be disposed on the second scan driver GDC2 (or the first scan driver GDC1). Accordingly, the second light emitting reference units may not overlap the corresponding driving circuits R_PD2, G1_PD2, G2_PD2, and B_PD2 electrically connected thereto.

In FIG. 4B, the second red driving circuit R_PD2 may be commonly connected to the two second red light emitting elements R_ED21 and R_ED22, and the second blue driving circuit B_PD2 may be commonly connected to the two second blue light emitting elements B_ED21 and B_ED22. As shown in FIG. 4B, the third green driving circuit G1_PD2 may be commonly connected to the two third green light emitting elements G1_ED21 and G1_ED22, and the fourth green driving circuit G2_PD2 may be commonly connected to the two fourth green light emitting elements G2_ED21 and G2_ED22. However, the disclosure should not be limited thereto or thereby. As an example, the number of the second red light emitting elements R_ED21 and R_ED22 commonly connected to the second red driving circuit R_PD2 may be changed in various ways. The number of the second red light emitting elements R_ED21 and R_ED22 commonly connected to the second red driving circuit R_PD2 may be different from the number of the second blue light emitting elements B_ED21 and B_ED22 commonly connected to the second blue driving circuit B_PD2.

The number of the third green light emitting elements G1_ED21 and G1_ED22 commonly connected to the third green driving circuit G1_PD2 may be the same as the number of the fourth green light emitting elements G2_ED21 and G2_ED22 commonly connected to the fourth green driving circuit G2_PD2. The number of the third green light emitting elements G1_ED21 and G1_ED22 commonly connected to the third green driving circuit G1_PD2 may be the same as the number of the second red light emitting elements R_ED21 and R_ED22 commonly connected to the second red driving circuit R_PD2. However, the disclosure should not be limited thereto or thereby. As an example, the number of the third green light emitting elements G1_ED21 and G1_ED22 commonly connected to the third green driving circuit G1_PD2 may be different from the number of the second red light emitting elements R_ED21 and R_ED22 commonly connected to the second red driving circuit R_PD2.

Referring to FIG. 4C, a first data line group DG1 including data lines DL1_1 to DL1_8 connected to the first reference units RU1 may be disposed in the first display area DA1, and a second data line group DG2 including data lines DL2_1 to DL2_8 connected to the second reference units RU2 may be disposed in the second display area DA2. For the convenience of explanation, FIG. 4C shows eight data lines DL1_1 to DL1_8 among the data lines included in the first data line group DG1 and eight data lines DL2_1 to DL2_8 among the data lines included in the second data line group DG2. However, the number of the data lines included in each of the first and second data line groups DG1 and DG2 should not be particularly limited.

The four data lines DL1_1 to DL1_4 may be connected to each of the first reference units RU1 shown in FIG. 4C. Each of the first reference units RU1 may include two first red driving circuits R_PD1, two first blue driving circuits B_PD1, two first green driving circuits G1_PD1, and two second green driving circuits G2_PD1. For example, the four data lines DL1_1 to DL1_4 may be required to drive eight light emitting elements included in each of the first reference units RU1. However, each of the second reference units RU2 may be connected to two data lines DL2_1 and DL2_2. Each of the second reference units RU2 may include a second red driving circuit R_PD2, a second blue driving circuit B_PD2, a third green driving circuit G1_PD2, and a fourth green driving circuit G2_PD2. For example, only two data lines DL2_1 and DL2_2 may be required to drive eight light emitting elements included in each of the second reference units RU2.

Figure 5A:
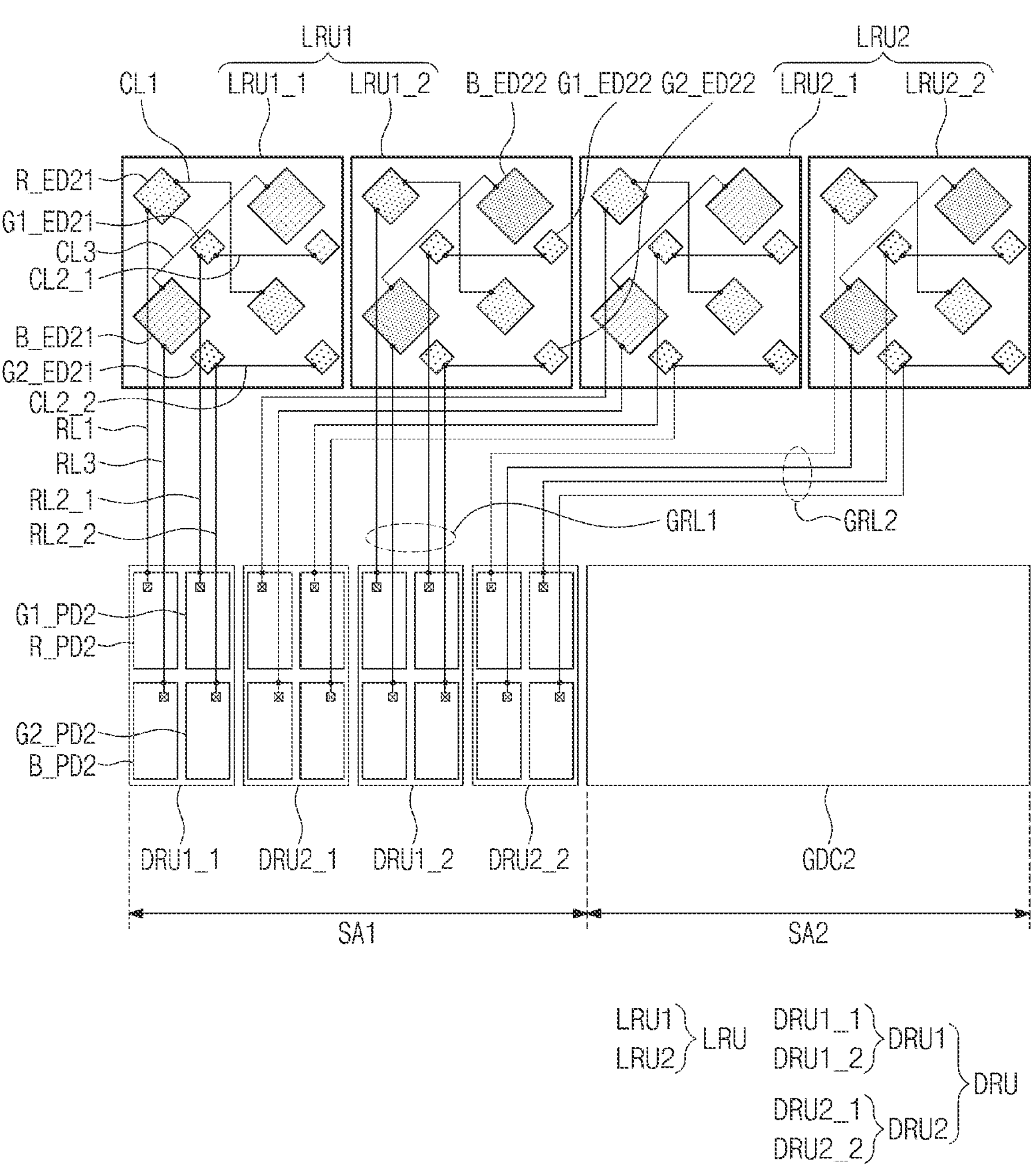
FIG. 5A is a schematic conceptual view showing a connection relation between light emitting reference units and driving reference units shown in FIG. 4C.
Figure 5B:
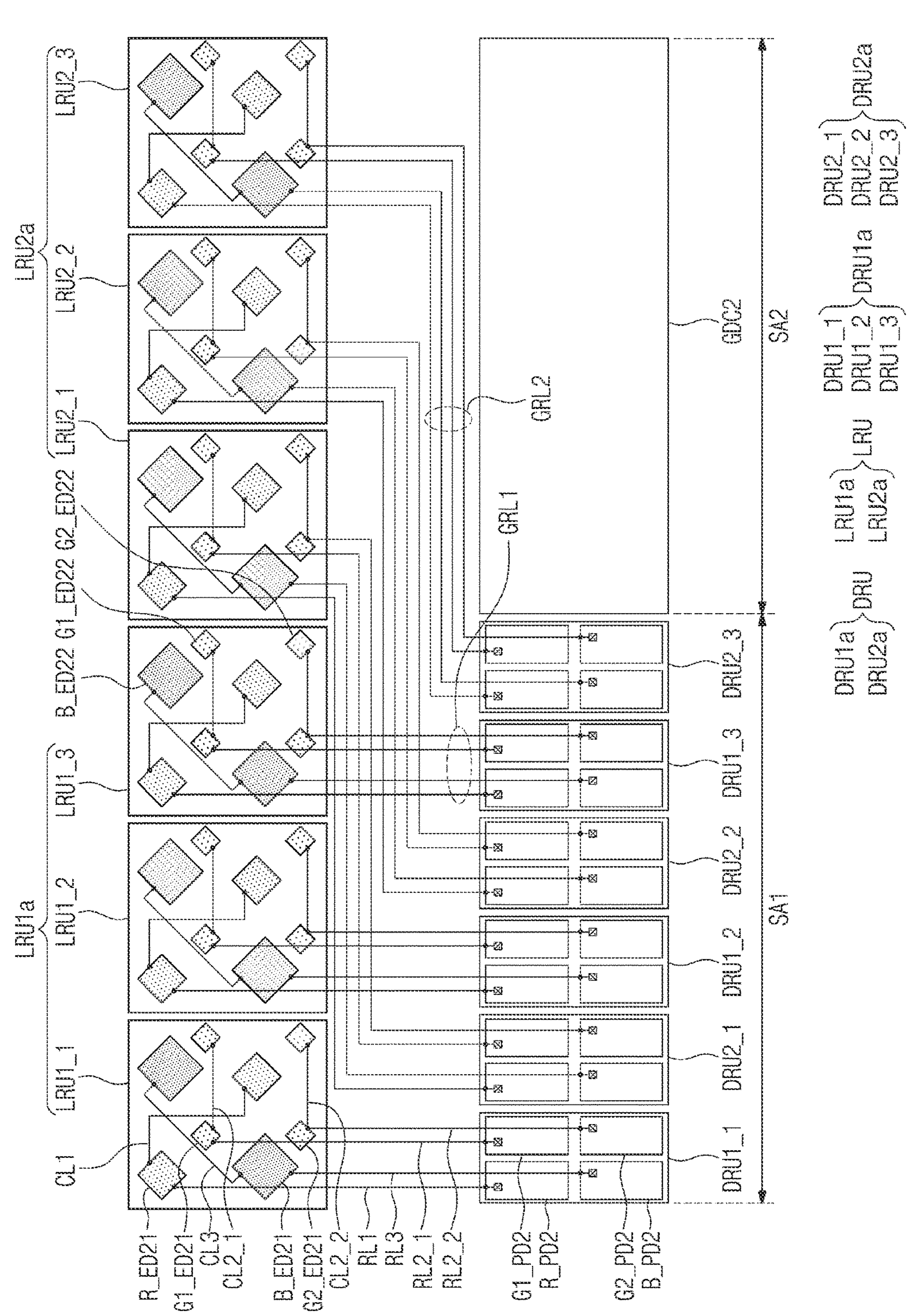
FIG. 5B is a schematic conceptual view showing a connection relation between light emitting reference units and driving reference units according to an embodiment of the disclosure.

FIG. 5A is a schematic conceptual view showing a connection relation between the light emitting reference units and the driving reference units shown in FIG. 4C. FIG. 5B is a schematic conceptual view showing a connection relation between light emitting reference units and driving reference units according to an embodiment of the disclosure.

Referring to FIG. 5A, first light emitting reference units LRU1 among the light emitting reference units LRU may be disposed in the first sub-area SA1, and second light emitting reference units LRU2 among the light emitting reference units LRU may be disposed in the second sub-area SA2. According to an embodiment, two first light emitting reference units LRU1_1 and LRU1_2 may be disposed in the first sub-area SA1, and two second light emitting reference units LRU2_1 and LRU2_2 may be disposed in the second sub-area SA2. However, the number of the first light emitting reference units LRU1_1 and LRU1_2 and the number of the second light emitting reference units LRU2_1 and LRU2_2 should not be limited thereto or thereby and may be changed in various ways. Hereinafter, for the convenience of explanation, the two first light emitting reference units LRU1_1 and LRU1_2 may be referred to as a first sub-light emitting unit LRU1_1 and a second sub-light emitting unit LRU1_2, respectively, and the two second light emitting reference units LRU2_1 and LRU2_2 may be referred to as a third sub-light emitting unit LRU2_1 and a fourth sub-light emitting unit LRU2_2, respectively.

Each of the first to fourth sub-light emitting units LRU1_1 to LRU2_2 may include the two second red light emitting elements R_ED21 and R_ED22, the two second blue light emitting elements B_ED21 and B_ED22, the two third green light emitting element G1_ED21 and G1_ED22, and the two fourth green light emitting elements G2_ED21 and G2_ED22. The number of the light emitting elements included in each of the sub-light emitting units should not be limited thereto or thereby.

The two second red light emitting elements R_ED21 and R_ED22 may be electrically connected to each other via a first connection line CL1, and the two second blue light emitting elements B_ED21 and B_ED22 may be electrically connected to each other via a third connection line CL3. The two third green light emitting elements G1_ED21 and G1_ED22 may be electrically connected to each other via a first sub-connection line CL2_1, and the two fourth green light emitting elements G2_ED21 and G2_ED22 may be electrically connected to each other via a second sub-connection line CL2_2. In a plan view, each of the first connection line CL1 and the third connection line CL3 may have a curved shape to include one or more curved portions. In a plan view, each of the first and second sub-connection lines CL2_1 and CL2_2 may have a straight line shape, however, the disclosure should not be limited thereto or thereby. Each of the first and second sub-connection lines CL2_1 and CL2_2 may have a curved shape depending on its design.

The driving reference units DRU may include first driving reference units DRU1 respectively connected to the first light emitting reference units LRU1 and second driving reference units DRU2 respectively connected to the second light emitting reference units LRU2. The first and second driving reference units DRU1 and DRU2 may be disposed in the first sub-area SA1, and the first and second driving reference units DRU1 and DRU2 may not overlap the second sub-area SA2. The second scan driver GDC2 (or the first scan driver GDC1, refer to FIG. 3A) may be disposed in second sub-area SA2.

According to an embodiment, the first driving reference units DRU1 may include two first driving reference units DRU1_1 and DRU1_2, and the second driving reference units DRU2 may include two second driving reference units DRU2_1 and DRU2_2. However, the number of the first driving reference units DRU1_1 and DRU1_2 and the number of the second driving reference units DRU2_1 and DRU2_2 should not be limited thereto or thereby. Hereinafter, for the convenience of explanation, the two first driving reference units DRU1_1 and DRU1_2 may be referred to as a first sub-driving unit DRU1_1 and a second sub-driving unit DRU1_2, respectively, and the two second driving reference units DRU2_1 and DRU2_2 may be referred to as a third sub-driving unit DRU2_1 and a fourth sub-driving unit DRU2_2, respectively.

Each of the first to fourth sub-driving units DRU1_1 to DRU2_2 may include the second red driving circuit R_PD2, the third green driving circuit G1_PD2, the fourth green driving circuit G2_PD2, and the second blue driving circuit B_PD2. The second red driving circuit R_PD2 may be commonly connected to the two second red light emitting elements R_ED21 and R_ED22, and the second blue driving circuit B_PD2 may be commonly connected to the two second blue light emitting elements B_ED21 and B_ED22. The third green driving circuit G1_PD2 may be commonly connected to the two third green light emitting elements G1_ED21 and G1_ED22, and the fourth green driving circuit G2_PD2 may be commonly connected to the two fourth green light emitting elements G2_ED21 and G2_ED22.

According to an embodiment, an arrangement order of the first and second light emitting reference units LRU1 and LRU2 may be different from an arrangement order of the first and second driving reference units DRU1 and DRU2. In detail, the first to fourth sub-light emitting units LRU1_1 to LRU2_2 may be arranged in an order of the first, second, third, and fourth sub-light emitting units LRU1_1, LRU1_2, LRU2_1, and LRU2_2, and the first to fourth sub-driving units DRU1_1 to DRU2_2 may be arranged in an order of the first, third, second, and fourth sub-driving units DRU1_1, DRU2_1, DRU1_2, and DRU2_2. According to an example, the first and second driving reference units DRU1 and DRU2 may be alternately arranged with each other.

The first sub-light emitting unit LRU1_1 may be disposed to overlap two sub-driving units, i.e., the first sub-driving unit DRU1_1 and the third sub-driving unit DRU2_1, in the first sub-area SA1, and the second sub-light emitting unit LRU1_2 may be disposed to overlap two sub-driving units, i.e., the second sub-driving unit DRU1_2 and the fourth sub-driving unit DRU2_2, in the first sub-area SA1. However, the third sub-light emitting unit LRU2_1 may not overlap the third sub-driving unit DRU2_1, and the fourth sub-light emitting unit LRU2_2 may not overlap the fourth sub-driving unit DRU2_2.

Each of the first to fourth sub-light emitting units LRU1_1 to LRU2_2 may be electrically connected to a corresponding sub-driving unit among the first to fourth sub-driving units DRU1_1 to DRU2_2 via routing lines. The first sub-light emitting unit LRU1_1 may be electrically connected to the first sub-driving unit DRU1_1 and may not be electrically connected to the third sub-driving unit DRU2_1. The second sub-light emitting unit LRU1_2 may be electrically connected to the second sub-driving unit DRU1_2 and may not be electrically connected to the fourth sub-driving unit DRU2_2.

The second red driving circuit R_PD2 may be connected to a second red light emitting element, e.g., the second red light emitting element R_ED21, between the two second red light emitting elements R_ED21 and R_ED22 via a first routing line RL1. The second blue driving circuit B_PD2 may be connected to a second blue light emitting element, e.g., the second blue light emitting element B_ED21, between the two second blue light emitting elements B_ED21 and B_ED22 via a third routing line RL3. The second red driving circuit R_PD2 may be disposed to overlap the second red light emitting element R_ED21 between the two second red light emitting elements R_ED21 and R_ED22, and the second blue driving circuit B_PD2 may be disposed to overlap the second blue light emitting element B_ED21 between the two second blue light emitting elements B_ED21 and B_ED22.

Since the two second red light emitting elements R_ED21 and R_ED22 may be connected to each other via the first connection line CL1, even though the second red driving circuit R_PD2 may be connected to a second red light emitting element R_ED21 between the two second red light emitting elements R_ED21 and R_ED22, the two second red light emitting elements R_ED21 and R_ED22 may be substantially simultaneously operated. Similarly, since the two second blue light emitting elements B_ED21 and B_ED22 may be connected to each other via the third connection line CL3, even though the second blue driving circuit B_PD2 may be connected to a second blue light emitting element B_ED21 between the two second blue light emitting elements B_ED21 and B_ED22, the two second blue light emitting elements B_ED21 and B_ED22 may be substantially simultaneously operated.

The third green driving circuit G1_PD2 may be connected to a third green light emitting element, e.g., the third green light emitting element G1_ED21, between the two third green light emitting elements G1_ED21 and G1_ED22 via a first sub-routing line RL2_1. The fourth green driving circuit G2_PD2 may be connected to a fourth green light emitting element, e.g., the fourth green light emitting element G2_ED21, between the two fourth green light emitting element G2_ED21 and G2_ED22 via a second sub-routing line RL2_2. The third green driving circuit G1_PD2 may be disposed to overlap the third green light emitting element G1_ED21 between the two third green light emitting elements G1_ED21 and G1_ED22, and the fourth green driving circuit G2_PD2 may be disposed to overlap the fourth green light emitting element G2_ED21 between the two fourth green light emitting elements G2_ED21 and G2_ED22.

The routing lines (or referred to as a first group of routing lines GRL1) that connect the first light emitting reference unit LRU1 and the first driving reference unit DRU1 disposed to overlap the first light emitting reference unit LRU1 may have a relatively shorter length than a length of the routing lines (or referred to as a second group of routing lines GRL2) that connect the second light emitting reference unit LRU2 and the second driving reference unit DRU2 that may not overlap the second light emitting reference unit LRU2. As described above, in the case where the arrangement order of the first and second light emitting reference units LRU1 and LRU2 may be different from the arrangement order of the first and second driving reference units DRU1 and DRU2, the length or the number of the routing lines may be reduced. As a result, this helps to solve the limitation in additionally arranging the light emitting elements, which may be caused by a narrow arrangement area for the routing lines, and thus, the second display area DA2 of the display device DD may be further expanded.

Referring to FIG. 5B, first light emitting reference units LRU1*a* of light emitting reference units LRU may be disposed to overlap a first sub-area SA1, and second light emitting reference units LRU2*a* of the light emitting reference units LRU may be disposed to overlap a second sub-area SA2. According to an embodiment, three first light emitting reference units LRU1_1, LRU1_2, and LRU1_3 may be disposed in the first sub-area SA1, and three second light emitting reference units LRU2_1, LRU2_2, and LRU2_3 may be disposed in the second sub-area SA2. However, the number of the first light emitting reference units LRU1_1, LRU1_2, and LRU1_3 and the number of the second light emitting reference units LRU2_1, LRU2_2, and LRU2_3 should not be limited thereto or thereby. Hereinafter, for the convenience of explanation, the three first light emitting reference units LRU1_1, LRU1_2, and LRU1_3 may be referred to as a first sub-light emitting unit LRU1_1, a second sub-light emitting unit LRU1_2, and a third sub-light emitting unit LRU1_3, respectively, and the three second light emitting reference units LRU2_1, LRU2_2, and LRU2_3 may be referred to as a fourth sub-light emitting unit LRU2_1, a fifth sub-light emitting unit LRU2_2, and a sixth sub-light emitting unit LRU2_3, respectively.

Driving reference units DRU may include first driving reference units DRU1*a* respectively connected to the first light emitting reference units LRU1*a* and second driving reference units DRU2*a* respectively connected to the second light emitting reference units LRU2*a*. The first and second driving reference units DRU1*a* and DRU2*a* may be disposed in the first sub-area SA1 and may not overlap the second sub-area SA2. The second scan driver GDC2 or the first scan driver GDC1 (refer to FIG. 3A) may be disposed in the second sub-area SA2.

According to an embodiment, the first driving reference units DRU1*a* may include three first driving reference units DRU1_1, DRU1_2, and DRU1_3, and the second driving reference units DRU2*a* may include three second driving reference units DRU2_1, DRU2_2, and DRU2_3. However, the number of the first driving reference units DRU1_1, DRU1_2, and DRU1_3 and the number of the second driving reference units DRU2_1, DRU2_2, and DRU2_3 should not be limited thereto or thereby. Hereinafter, for the convenience of explanation, the three first driving reference units DRU1_1, DRU1_2, and DRU1_3 may be referred to as a first sub-driving unit DRU1_1, a second sub-driving unit DRU1_2, and a third sub-driving unit DRU1_3, respectively. The three second driving reference units DRU2_1, DRU2_2, and DRU2_3 may be referred to as a fourth sub-driving unit DRU2_1, a fifth sub-driving unit DRU2_2, and a sixth sub-driving unit DRU2_3, respectively.

According to an embodiment, an arrangement order of the first and second light emitting reference units LRU1*a* and LRU2*a* may be different from an arrangement order of the first and second driving reference units DRU1*a* and DRU2*a*. In detail, the first to sixth sub-light emitting units LRU1_1 to LRU2_3 may be arranged in an order of the first, second, third, fourth, fifth, and sixth sub-light emitting units LRU1_1, LRU1_2, LRU1_3, LRU2_1, LRU2_2, and LRU2_3. The first to sixth sub-driving units DRU1_1 to DRU2_3 may be arranged in an order of the first, fourth, second, fifth, third, and sixth sub-driving units DRU1_1, DRU2_1, DRU1_2, DRU2_2, DRU1_3, and DRU2_3. As an example, the first and second driving reference units DRU1*a* and DRU2*a* may be alternately arranged with each other.

The first sub-light emitting unit LRU1_1 may be disposed to overlap two sub-driving units, i.e., the first sub-driving unit DRU1_1 and the fourth sub-driving unit DRU2_1, and the second sub-light emitting unit LRU1_2 may be disposed to overlap two sub-driving units, i.e., the second sub-driving unit DRU1_2 and the fifth sub-light emitting unit LRU2_2. The third sub-light emitting unit LRU1_3 may be disposed to overlap two sub-driving units, i.e., the third sub-driving unit DRU1_3 and the sixth sub-driving unit DRU2_3. However, the fourth sub-light emitting unit LRU2_1 may not overlap the fourth sub-driving unit DRU2_1, the fifth sub-light emitting unit LRU2_2 may not overlap the fifth sub-driving unit DRU2_2, and the sixth sub-light emitting unit LRU2_3 may not overlap the sixth sub-driving unit DRU2_3.

Each of the first to sixth sub-light emitting units LRU1_1 to LRU2_3 may be electrically connected to a corresponding sub-driving unit among the first to sixth sub-driving units DRU1_1 to DRU2_3 via routing lines. The first sub-light emitting unit LRU1_1 may be electrically connected to the first sub-driving unit DRU1_1 and may not be electrically connected to the fourth sub-driving unit DRU2_1. The second sub-light emitting unit LRU1_2 may be electrically connected to the second sub-driving unit DRU1_2 and may not be electrically connected to the fifth sub-driving unit DRU2_2. The third sub-light emitting unit LRU1_3 may be electrically connected to the third sub-driving unit DRU1_3 and may not be electrically connected to the sixth sub-driving unit DRU2_3.

The routing lines (or referred to as a first group of routing lines GRL1) that connect the first light emitting reference unit LRU1*a* and the first driving reference unit DRU1*a* overlapping the first light emitting reference unit LRU1*a* may have a relatively shorter length than that of the routing lines (or referred to as a second group of routing lines GRL2) that connect the second light emitting reference unit LRU2*a* and the second driving reference unit DRU2*a* that may not overlap the second light emitting reference unit LRU2*a*. As described above, in the case where the arrangement order of the first and second light emitting reference units LRU1*a* and LRU2*a* may be different from the arrangement order of the first and second driving reference units DRU1*a* and DRU2*a*, the length or the number of the routing lines may be reduced. As a result, this helps to solve the limitation in additionally arranging the light emitting elements, which may be caused by a narrow arrangement area for the routing lines, and thus, the second display area DA2 of the display device DD may be further expanded.

Figure 6A:
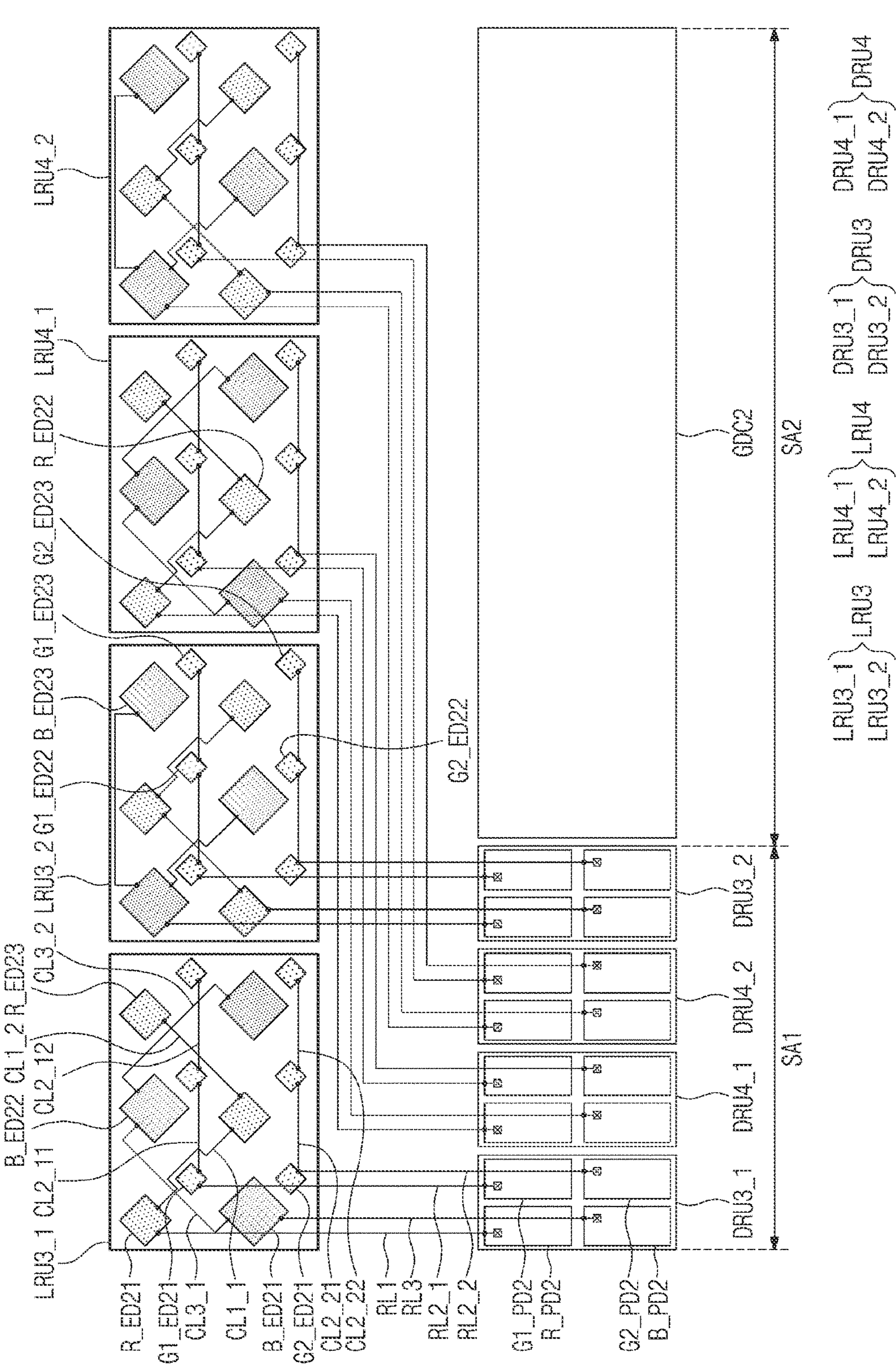

FIGS. 6A and 6B are schematic conceptual views showing a connection relation between light emitting reference units and driving reference units according to an embodiment of the disclosure.

Referring to FIG. 6A, first light emitting reference units LRU3 among light emitting reference units may be disposed to overlap a first sub-area SA1, and second light emitting reference units LRU4 among the light emitting reference units may be disposed to overlap a second sub-area SA2. According to an embodiment, two first light emitting reference units LRU3_1 and LRU3_2 may be disposed to overlap the first sub-area SA1. According to an embodiment, two second light emitting reference units LRU4_1 and LRU4_2 may be disposed in the second sub-area SA2. However, the number of the first light emitting reference units LRU3_1 and LRU3_2 and the number of the second light emitting reference units LRU4_1 and LRU4_2 should not be limited thereto or thereby and may be changed in various ways. Hereinafter, for the convenience of explanation, the two first light emitting reference units LRU3_1 and LRU3_2 may be referred to as a first sub-light emitting unit LRU3_1 and a second sub-light emitting unit LRU3_2, respectively, and the two second light emitting reference units LRU4_1 and LRU4_2 may be referred to as a third sub-light emitting unit LRU4_1 and a fourth sub-light emitting unit LRU4_2, respectively.

Each of the first to fourth sub-light emitting units LRU3_1 to LRU4_2 may include three second red light emitting elements R_ED21, R_ED22, and R_ED23, three second blue light emitting elements B_ED21, B_ED22, and B_ED23, three third green light emitting elements G1_ED21, G1_ED22, and G1_ED23, and three fourth green light emitting elements G2_ED21, G2_ED22, and G2_ED23. The number of the light emitting elements included in each sub-light emitting unit should not be limited thereto or thereby.

The three second red light emitting elements R_ED21, R_ED22, and R_ED23 may be electrically connected to each other via first connection lines CL1_1 and CL1_2, and the three second blue light emitting elements B_ED21, B_ED22, and B_ED23 may be electrically connected to each other via third connection lines CL3_1 and CL3_2. The three third green light emitting elements G1_ED21, G1_ED22, and G1_ED23 may be electrically connected to each other via first sub-connection lines CL2_11 and CL2_12, and the three fourth green light emitting elements G2_ED21, G2_ED22, and G2_ED23 may be electrically connected to each other via second sub-connection line CL2_21 and CL2_22.

Driving reference units may include first driving reference units DRU3 respectively connected to the first light emitting reference units LRU3 and second driving reference units DRU4 respectively connected to the second light emitting reference units LRU4. The first and second driving reference units DRU3 and DRU4 may be disposed in the first sub-area SA1 and may not overlap the second sub-area SA2. The second scan driver GDC2 (or the first scan driver GDC1, refer to FIG. 3A) may be disposed in the second sub-area SA2.

According to an embodiment, the first driving reference units DRU3 may include two first driving reference units DRU3_1 and DRU3_2, and the second driving reference units DRU4 may include two second driving reference units DRU4_1 and DRU4_2. However, the number of the first driving reference units DRU3_1 and DRU3_2 and the number of the second driving reference units DRU4_1 and DRU4_2 should not be limited thereto or thereby and may be changed in various ways. Hereinafter, for the convenience of explanation, the two first driving reference units DRU3_1 and DRU3_2 may be referred to as a first sub-driving unit DRU3_1 and a second sub-driving unit DRU3_2, respectively, and the two second driving reference units DRU4_1 and DRU4_2 may be referred to as a third sub-driving unit DRU4_1 and a fourth sub-driving unit DRU4_2, respectively.

Each of the first to fourth sub-driving units DRU3_1 to DRU4_2 may include a second red driving circuit R_PD2, a third green driving circuit G1_PD2, a fourth green driving circuit G2_PD2, and a second blue driving circuit B_PD2. The second red driving circuit R_PD2 may be commonly connected to the three second red light emitting elements R_ED21, R_ED22, and R_ED23, and the second blue driving circuit B_PD2 may be commonly connected to the three second blue light emitting elements B_ED21, B_ED22, and B_ED23. The third green driving circuit G1_PD2 may be commonly connected to the three third green light emitting elements G1_ED21, G1_ED22, and G1_ED23, and the fourth green driving circuit G2_PD2 may be commonly connected to the three fourth green light emitting elements G2_ED21, G2_ED22, and G2_ED23.

According to an embodiment, an arrangement order of the first and second light emitting reference units LRU3 and LRU4 may be different from an arrangement order of the first and second driving reference units DRU3 and DRU4. In detail, the first to fourth sub-light emitting units LRU3_1 to LRU4_2 may be arranged in an order of the first, second, third, and fourth sub-light emitting units LRU3_1, LRU3_2, LRU4_1, and LRU4_2, and the first to fourth sub-driving units DRU3_1 to DRU4_2 may be arranged in an order of the first, third, fourth, and second sub-driving units DRU3_1, DRU4_1, DRU4_2, and DRU3_2. As an example, the first and second driving reference units DRU3 and DRU4 may be alternately arranged with each other.

The first sub-light emitting unit LRU3_1 may be disposed to overlap three sub-driving units, i.e., the first sub-driving unit DRU3_1, the third sub-driving unit DRU4_1, and the fourth sub-driving unit DRU4_2. The second sub-light emitting unit LRU3_2 may be disposed to overlap the second sub-driving unit DRU3_2. However, the third sub-light emitting unit LRU4_1 may not overlap the third sub-driving unit DRU4_1, and the fourth sub-light emitting unit LRU4_2 may not overlap the fourth sub-driving unit DRU4_2.

Each of the first to fourth sub-light emitting units LRU3_1 to LRU4_2 may be electrically connected to a corresponding sub-driving unit among the first to fourth sub-driving units DRU3_1 to DRU4_2 via routing lines. The first sub-light emitting unit LRU3_1 may be electrically connected to the first sub-driving unit DRU3_1 and may not be electrically connected to the third sub-driving unit DRU4_1 and the fourth sub-driving unit DRU4_2. The second sub-light emitting unit LRU3_2 may be electrically connected to the second sub-driving unit DRU3_2.

The second red driving circuit R_PD2 may be connected to one of the three second red light emitting elements R_ED21, R_ED22, and R_ED23, e.g., the second red light emitting element R_ED21, via a first routing line RL1. The second blue driving circuit B_PD2 may be connected to one of the three second blue light emitting elements B_ED21, B_ED22, and B_ED23, e.g., the second blue light emitting element B_ED21, via a third routing line RL3. The second red driving circuit R_PD2 may be disposed to overlap the second red light emitting element R_ED21 among the three second red light emitting elements R_ED21, R_ED22, and R_ED23, and the second blue driving circuit B_PD2 may be disposed to overlap the second blue light emitting element B_ED21 among the three second blue light emitting elements B_ED21, B_ED22, and B_ED23.

Since the three second red light emitting elements R_ED21, R_ED22, and R_ED23 may be connected to each other via the first connection lines CL1_1 and CL1_2, although the second red driving circuit R_PD2 may be connected to a second red light emitting element R_ED21 among the three second red light emitting elements R_ED21, R_ED22, and R_ED23, the three second red light emitting elements R_ED21, R_ED22, and R_ED23 may be substantially simultaneously operated. Similarly, since the three second blue light emitting elements B_ED21, B_ED22, and B_ED23 may be connected to each other via the third connection lines CL3_1 and CL3_2, although the second blue driving circuit B_PD2 may be connected to a second blue light emitting element B_ED21 among the second blue light emitting elements B_ED21, B_ED22, and B_ED23, the three second blue light emitting elements B_ED21, B_ED22, and B_ED23 may be substantially simultaneously operated.

The third green driving circuit G1_PD2 may be connected to one of the third green light emitting elements G1_ED21, G1_ED22, and G1_ED23, e.g., the third green light emitting element G1_ED21, via first sub-routing line RL2_1. The fourth green driving circuit G2_PD2 may be connected to one of the three fourth green light emitting elements G2_ED21, G2_ED22, and G2_ED23, e.g., the fourth green light emitting element G2_ED21, via second sub-routing line RL2_2. The third green driving circuit G1_PD2 may be disposed to overlap the third green light emitting element G1_ED21 among the three third green light emitting elements G1_ED21, G1_ED22, and G1_ED23, and the fourth green driving circuit G2_PD2 may be disposed to overlap the fourth green light emitting element G2_ED21 among the fourth green light emitting elements G2_ED21, G2_ED22, and G2_ED23.

The routing lines (or referred to as a first group of routing lines) connecting the first light emitting reference unit LRU3 and the first driving reference unit DRU3 that overlaps the first light emitting reference unit LRU3 may have a relatively shorter length than a length of the routing lines (or referred to as a second group of routing lines) connecting the second light emitting reference unit LRU4 and the second driving reference unit DRU4 that may not overlap the second light emitting reference unit LRU4. As described above, even though the number of the light emitting elements included in each of the first and second light emitting reference units LRU3 and LRU4 increases, the length or the number of the routing lines may be reduced in case that the arrangement order of the first and second light emitting reference units LRU3 and LRU4 is different from the arrangement order of the first and second driving reference units DRU3 and DRU4.

Referring to FIG. 6B, first light emitting reference units LRU5 among light emitting reference units may be disposed to overlap a first sub-area SA1, and a second light emitting reference unit LRU6 among the light emitting reference units may be disposed to overlap a second sub-area SA2. According to an embodiment, two first light emitting reference units LRU5_1 and LRU5_2 may be disposed to overlap the first sub-area SA1. According to an embodiment, a second light emitting reference unit LRU6 may be disposed in the second sub-area SA2. However, the number of the first light emitting reference units LRU5 and the number of the second light emitting reference units LRU6 should not be limited thereto or thereby and may be changed in various ways. Hereinafter, for the convenience of explanation, the two first light emitting reference units LRU5_1 and LRU5_2 may be referred to as a first sub-light emitting unit LRU5_1 and a second sub-light emitting unit LRU5_2, respectively. The second light emitting reference unit LRU6 may be referred to as a third sub-light emitting unit LRU6.

Each of the first to third sub-light emitting units LRU5_1, LRU5_2, and LRU6 may include four second red light emitting elements R_ED21, R_ED22, R_ED23, and R_ED24, four second blue light emitting elements B_ED21, B_ED22, B_ED23, and B_ED24, four third green light emitting elements G1_ED21, G1_ED22, G1_ED23, and G1_ED24, and four fourth green light emitting elements G2_ED21, G2_ED22, G2_ED23, and G2_ED24. However, the number of the light emitting elements included in each of the sub-light emitting units LRU5_1, LRU5_2, and LRU6 should not be limited thereto or thereby.

The four second red light emitting elements R_ED21, R_ED22, R_ED23, and R_ED24 may be electrically connected to each other via first connection lines CL1_1, CL1_2, and CL1_3, the four second blue light emitting elements B_ED21, B_ED22, B_ED23, and B_ED24 may be electrically connected to each other via third connection lines CL3_1, CL3_2, and CL3_3. The four third green light emitting elements G1_ED21, G1_ED22, G1_ED23, and G1_ED24 may be electrically connected to each other via first sub-connection lines CL2_11, CL2_12, and CL2_13, and the four fourth green light emitting elements G2_ED21, G2_ED22, G2_ED23, and G2_ED24 may be electrically connected to each other via second sub-connection lines CL2_21, CL2_22, and CL2_23.

Driving reference units may include first driving reference units DRU5 respectively connected to the first light emitting reference units LRU5 and a second driving reference unit DRU6 connected to the second light emitting reference unit LRU6. The first and second driving reference units DRU5 and DRU6 may be disposed in the first sub-area SA1 and may not overlap the second sub-area SA2. The second scan driver GDC2 (or the first scan driver GDC1, refer to FIG. 3A) may be disposed in the second sub-area SA2.

According to an embodiment, the first driving reference units DRU5 may include two first driving reference units DRU5_1 and DRU5_2. However, the number of the first driving reference units DRU5_1 and DRU5_2 and the number of the second driving reference units DRU6 should not be limited thereto or thereby and may be changed in various ways. Hereinafter, for the convenience of explanation, the two first driving reference units DRU5_1 and DRU5_2 may be referred to as a first sub-driving unit DRU5_1 and a second sub-driving unit DRU5_2, and the second driving reference unit DRU6 may be referred to as a third sub-driving unit DRU6.

Each of the first, second, and third sub-driving units DRU5_1, DRU5_2, and DRU6 may include a second red driving circuit R_PD2, a third green driving circuit G1_PD2, a fourth green driving circuit G2_PD2, and a second blue driving circuit B_PD2. The second red driving circuit R_PD2 may be commonly connected to the four second red light emitting elements R_ED21, R_ED22, R_ED23, and R_ED24, and the second blue driving circuit B_PD2 may be commonly connected to the four second blue light emitting elements B_ED21, B_ED22, B_ED23, and B_ED24. The third green driving circuit G1_PD2 may be commonly connected to the four third green light emitting elements G1_ED21, G1_ED22, G1_ED23, and G1_ED24, and the fourth green driving circuit G2_PD2 may be commonly connected to the four fourth green light emitting elements G2_ED21, G2_ED22, G2_ED23, and G2_ED24.

According to an embodiment, an arrangement order of the first, second, and third sub-light emitting units LRU5_1, LRU5_2, and LRU6 may be different from an arrangement order of the first, second, and third sub-driving units DRU5_1, DRU5_2, and DRU6. In detail, the first, second, and third sub-light emitting units LRU5_1, LRU5_2, and LRU6 may be arranged in an order of the first, second, and third sub-light emitting units LRU5_1, LRU5_2, and LRU6, and the first, second, and third sub-driving units DRU5_1, DRU5_2, and DRU6 may be arranged in an order of the first, third, and second sub-driving units DRU5_1, DRU6, and DRU5_2.

The first sub-light emitting unit LRU5_1 may be disposed to overlap the first sub-driving unit DRU5_1, and the second sub-light emitting unit LRU5_2 may be disposed to partially overlap the second sub-driving unit DRU5_2. However, the third sub-light emitting unit LRU6 may not overlap the third sub-driving unit DRU6.

Each of the first, second, and third sub-light emitting units LRU5_1, LRU5_2, and LRU6 may be electrically connected to a corresponding sub-driving unit among the first, second, and third sub-driving units DRU5_1, DRU5_2, and DRU6 via routing lines. In detail, the second red driving circuit R_PD2 may be connected to one of the four second red light emitting elements R_ED21, R_ED22, R_ED23, and R_ED24, e.g., the second red light emitting element R_ED21, via a first routing line RL1. The second blue driving circuit B_PD2 may be connected to one of the four second blue light emitting elements B_ED21, B_ED22, B_ED23, and B_ED24, e.g., the second blue light emitting element B_ED22, via a third routing line RL3. The second red driving circuit R_PD2 may be disposed to overlap the second red light emitting element R_ED21 among the second red light emitting elements R_ED21, R_ED22, R_ED23, and R_ED24, and the second blue driving circuit B_PD2 may be disposed to overlap the second blue light emitting element B_ED22 among the second blue light emitting elements B_ED21, B_ED22, B_ED23, and R_ED24.

The third green driving circuit G1_PD2 may be connected to one of the four third green light emitting elements G1_ED21, G1_ED22, G1_ED23, and G1_ED24, e.g., the third green light emitting element G1_ED21, via a first sub-routing line RL2_1. The fourth green driving circuit G2_PD2 may be connected to one of the four fourth green light emitting elements G2_ED21, G2_ED22, G2_ED23, and G2_ED24, e.g., the fourth green light emitting element G2_ED21, via a second sub-routing line RL2_2. The third green driving circuit G1_PD2 may be disposed to overlap the third green light emitting element G1_ED21 among the third green light emitting elements G1_ED21, G1_ED22, G1_ED23, and G1_ED24. However, the fourth green driving circuit G2_PD2 may not overlap the fourth green light emitting element G2_ED21 among the four fourth green light emitting elements G2_ED21, G2_ED22, G2_ED23, and G2_ED24, and the fourth green light emitting element G2_ED21 may be disposed closest to the fourth green driving circuit G2_PD2 among the four fourth green light emitting elements G2_ED21, G2_ED22, G2_ED23, and G2_ED24.

The routing lines (or referred to as a first group of routing lines) connecting the first sub-light emitting unit LRU5_1 and the first sub-driving unit DRU5_1 that overlaps the first sub-light emitting unit LRU5_1 may have a relatively shorter length than a length of the routing lines (or referred to as a second group of routing lines) connecting the third sub-light emitting unit LRU6 and the third sub-driving unit DRU6 that may not overlap the third sub-light emitting unit LRU6. As described above, even though the number of the light emitting elements included in each of the first, second, and third sub-light emitting units LRU5_1, LRU5_2, and LRU6 increases, the length or number of the routing lines may be reduced in case that the arrangement order of the first, second, and third sub-light emitting units LRU5_1, LRU5_2, and LRU6 is different from the arrangement order of the first, second, and third sub-driving units DRU5_1, DRU5_2, and DRU6.

Figure 7B:
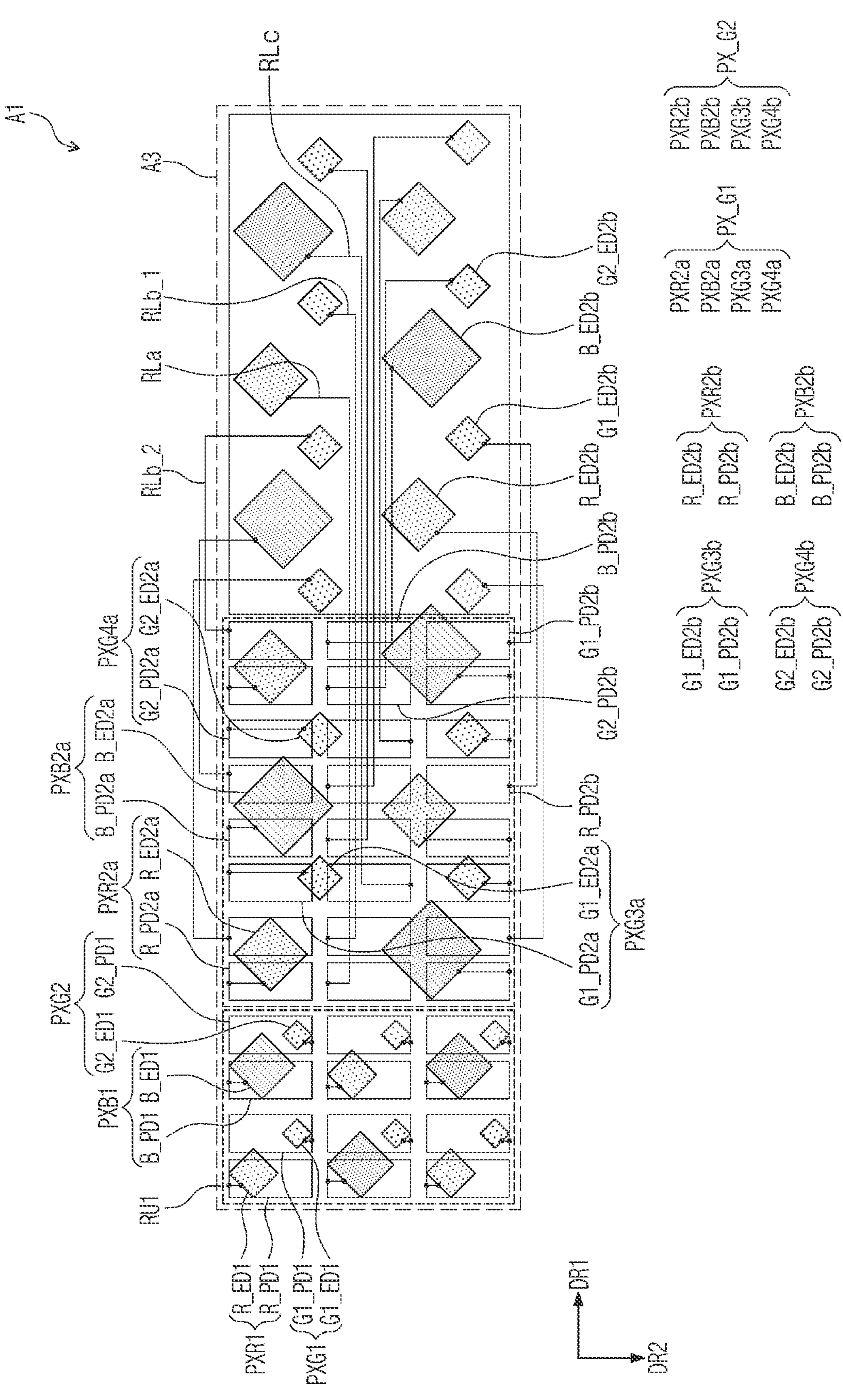
FIG. 7B is a schematic conceptual view showing a connection relation between light emitting elements and driving circuits of an area shown in FIG. 7A.

FIG. 7A is an enlarged schematic plan view showing an area A1 shown in FIG. 3A according to an embodiment of the disclosure, and FIG. 7B is a schematic conceptual view showing a connection relation between light emitting elements and driving circuits of an area A3 shown in FIG. 7A. In FIGS. 7A and 7B, the same reference numerals denote the same elements in FIGS. 4A and 4B, and thus, detailed descriptions of the same elements will be omitted.

Referring to FIGS. 7A and 7B, the second display area DA2 of the display panel DP (refer to FIG. 3A) may include a first sub-area SA1 and a second sub-area SA2. In detail, the fourth edge display area DA2_E4 of the second display area DA2 may be divided into the first sub-area SA1 and the second sub-area SA2. The third edge display area DA2_E3 (refer to FIG. 3A) of the second display area DA2 may also be divided into the first sub-area SA1 and the second sub-area SA2.

The pixels may be disposed in the second display area DA2 of the display panel DP. Some pixels of the pixels disposed in the second display area DA2 may be disposed in the first sub-area SA1, and other pixels of the pixels disposed in the second display area DA2 may be disposed in the second sub-area SA2. Hereinafter, for the convenience of explanation, the pixels disposed in the first sub-area SA1 may be referred to as a first pixel group PX_G1, and the pixels disposed in the second sub-area SA2 may be referred to as a second pixel group PX_G2. The first pixel group PX_G1 may include multiple second red pixels PXR2*a*, multiple third green pixels PXG3*a*, multiple fourth green pixels PXG4*a*, and multiple second blue pixels PXB2*a*. The second pixel group PX_G2 may include multiple third red pixels PXR2*b*, multiple fifth green pixels PXG3*b*, multiple sixth green pixels PXG4*b*, and multiple third blue pixels PXB2*b*.

Each of the second red pixels PXR2*a* may include a second red light emitting element R_ED2*a* and a second red driving circuit R_PD2*a*, and each of the second blue pixels PXB2*a* may include a second blue light emitting element B_ED2*a* and a second blue driving circuit B_PD2*a*. Each of the third green pixels PXG3*a* may include a third green light emitting element G1_ED2*a* and a third green driving circuit G1_PD2*a*, and each of the fourth green pixels PXG4*a* may include a fourth green light emitting element G2_ED2*a* and a fourth green driving circuit G2_PD2*a*.

Each of the third red pixels PXR2*b* may include a third red light emitting element R_ED2*b* and a third red driving circuit R_PD2*b*, and each of the third blue pixels PXB2*b* may include a third blue light emitting element B_ED2*b* and a third blue driving circuit B_PD2*b*. Each of the fifth green pixels PXG3*b* may include a fifth green light emitting element G1_ED2*b* and a fifth green driving circuit G1_PD2*b*, and each of the sixth green pixels PXG4*b* may include a sixth green light emitting element G2_ED2*b* and a sixth green driving circuit G2_PD2*b*. According to an embodiment, each of the second red driving circuit R_PD2*a*, the second blue driving circuit B_PD2*a*, the third green driving circuit G1_PD2*a*, and the fourth green driving circuit G2_PD2*a* may be referred to as a first pixel driving circuit. Each of the third red driving circuit R_PD2*b*, the third blue driving circuit B_PD2*b*, the fifth green driving circuit G1_PD2*b*, and the sixth green driving circuit G2_PD2*b* may be referred to as a second pixel driving circuit.

The second and third red light emitting elements R_ED2*a* and R_ED2*b* may have the same shape and size as each other. According to an embodiment, each of the second and third red light emitting elements R_ED2*a* and R_ED2*b* may have the size greater than that of a first red light emitting element R_ED1 (or referred to as a first reference light emitting element). The second and third blue light emitting elements B_ED2*a* and B_ED2*b* may have the same shape and size as each other. According to an embodiment, each of the second and third blue light emitting elements B_ED2*a* and B_ED2*b* may have the size greater than that of a first blue light emitting element B_ED1 (or referred to as a third reference light emitting element). Each of the third, fourth, fifth, and sixth green light emitting elements G1_ED2*a*, G1_ED2*b*, G2_ED2*a*, and G2_ED2*b* may have a size greater than a size of each of first and second green light emitting elements G1_ED1 and G2_ED1 (or referred to as a second reference light emitting element).

The second red light emitting element R_ED2*a* may overlap the second red driving circuit R_PD2*a*, but the third red light emitting element R_ED2*b* may not overlap the third red driving circuit R_PD2*b*. Accordingly, the third red light emitting element R_ED2*b* and the third red driving circuit R_PD2*b* may be electrically connected to each other via a first routing line RLa. The second blue light emitting element B_ED2*a* may overlap the second blue driving circuit B_PD2*a*, but the third blue light emitting element B_ED2*b* may not overlap the third blue driving circuit B_PD2*b*. Accordingly, the third blue light emitting element B_ED2*b* and the third blue driving circuit B_PD2*b* may be electrically connected to each other via a third routing line RLc.

The third green light emitting element G1_ED2*a* may overlap the third green driving circuit G1_PD2*a*, but the fifth green light emitting element G1_ED2*b* may not overlap the fifth green driving circuit G1_PD2*b*. Accordingly, the fifth green light emitting element G1_ED2*b* and the fifth green driving circuit G1_PD2*b* may be electrically connected to each other via a first sub-routing line RLb_1. The fourth green light emitting element G2_ED2*a* may overlap the fourth green driving circuit G2_PD2*a*, but the sixth green light emitting element G2_ED2*b* may not overlap the sixth green driving circuit G2_PD2*b*. Accordingly, the sixth green light emitting element G2_ED2*b* may be electrically connected to the sixth green driving circuit G2_PD2*b* via a second sub-routing line RLb_2.

The first pixel driving circuits R_PD2*a*, B_PD2*a*, G1_PD2*a*, and G2_PD2*a* may be alternately arranged with the second pixel driving circuits R_PD2*b*, B_PD2*b*, G1_PD2*b*, and G2_PD2*b* in the first and second directions DR1 and DR2.

According to an embodiment, the light emitting elements disposed in the first sub-area SA1 may be electrically connected to the driving circuit overlapping therewith, however, the light emitting elements disposed in the second sub-area SA2 may be electrically connected to the driving circuit that may not overlap therewith. As some of the light emitting elements disposed in the first sub-area SA1 may not be electrically connected to the driving circuit that may not overlap therewith, the length and number of the routing lines disposed in the second display area DA2 may be reduced. Accordingly, this helps to solve the limitation in additionally arranging the light emitting elements, which may be caused by a narrow arrangement area for the routing lines, and thus, the second display area DA2 of the display device DD may be further expanded.

Figure 8A:
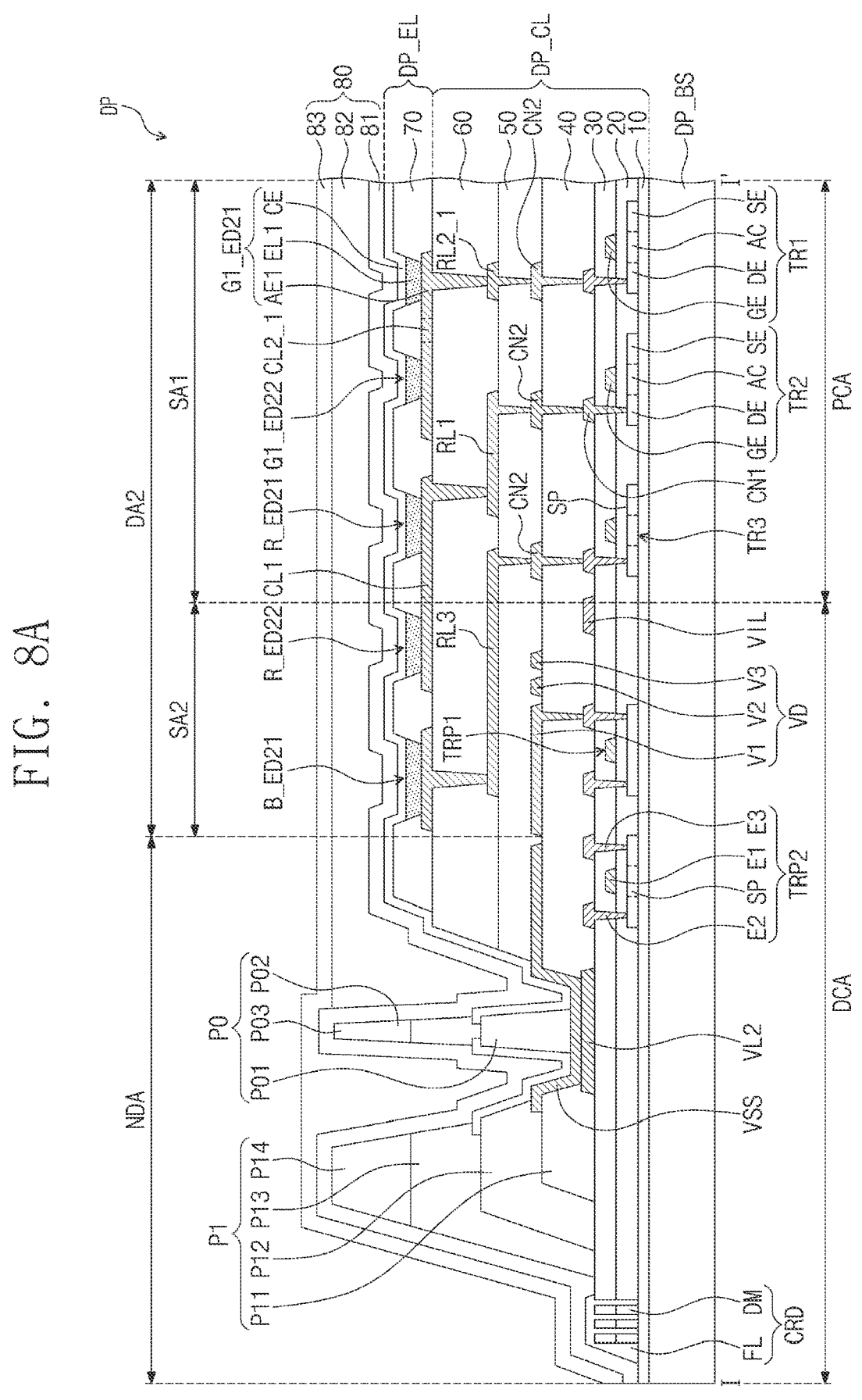
Figure 8B:
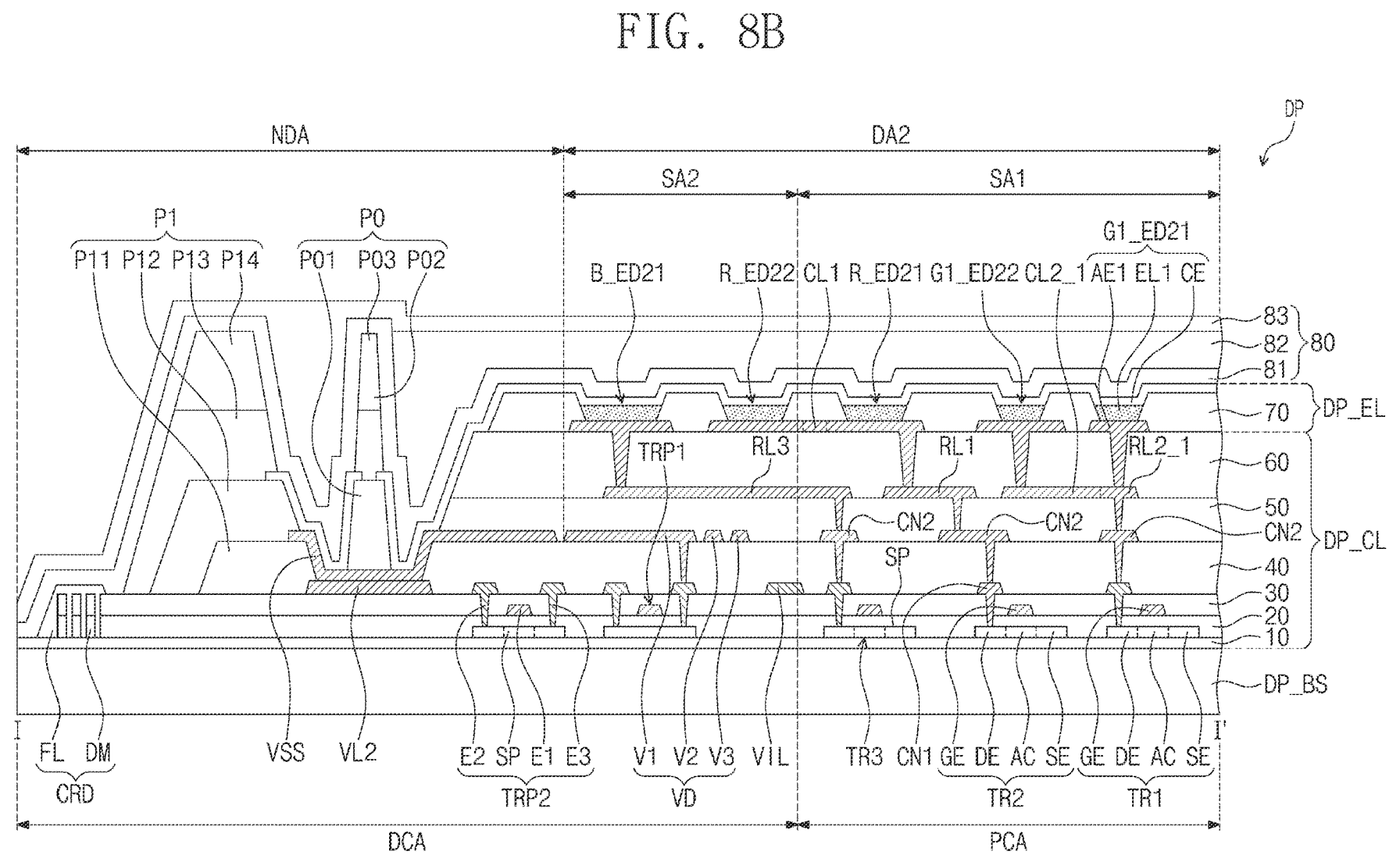

FIG. 8A is a schematic cross-sectional view of the display panel DP taken along line I-I' shown in FIG. 3A. FIG. 8B is a schematic cross-sectional view of a display panel DP according to an embodiment of the disclosure. FIG. 8B shows the display panel DP in an area corresponding to that of FIG. 8A.

Referring to FIG. 8A, the display panel DP may include a base layer DP_BS, a circuit layer DP_CL, a light emitting element layer DP_EL, and an encapsulation layer 80. The base layer DP_BS may provide a base surface on which the circuit layer DP_CL may be disposed. The base layer DP_BS may be a rigid layer or a flexible layer that may be bendable, foldable, or rollable. The base layer DP_BS may be a glass substrate, a metal substrate, or a polymer substrate. However, embodiments should not be limited thereto or thereby, and the base layer DP_BS may be an inorganic layer, an organic layer, or a composite material layer.

The base layer DP_BS may have a multi-layer structure. For instance, the base layer DP_BS may include a first synthetic resin layer, an intermediate layer having a single or multi-layer structure, and a second synthetic resin layer disposed on the intermediate layer. The intermediate layer may be referred to as a base barrier layer. The intermediate layer may include a silicon oxide (SiOx) layer and an amorphous silicon (a-Si) layer disposed on the silicon oxide layer, however, embodiments should not be particularly limited. As an example, the intermediate layer may include at least one of a silicon oxide layer, a silicon nitride layer, a silicon oxynitride layer, and an amorphous silicon layer.

Each of the first and second synthetic resin layers may include a polyimide-based resin. Each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "X-based resin" means that a functional group of "X" may be included.

According to an embodiment, the base layer DP_BS may be divided into the first display area DA1 (refer to FIG. 3A), the second display area DA2, and the non-display area NDA in a plan view. The second display area DA2 may include the first and second sub-areas SA1 and SA2. The first and second display areas DA1 and DA2 may be areas in which the image may be displayed, and the non-display area NDA may be an area in which the image may not be displayed. The first sub-area SA1 may be disposed adjacent to the first display area DA1, and the second sub-area SA2 may be disposed adjacent to the non-display area NDA.

The circuit layer DP_CL may be disposed on the base layer DP_BS. The circuit layer DP_CL may include an insulating layer, a semiconductor pattern, a conductive pattern, and a signal line. An insulating layer, a semiconductor layer, and a conductive layer may be formed on the base layer DP_BS by a coating or depositing process. The insulating layer, the semiconductor layer, and the conductive layer may be selectively patterned through several photolithography processes. Thus, the semiconductor pattern, the conductive pattern, and the signal line included in the circuit layer DP_CL may be formed.

The circuit layer DP_CL may include insulating layers 10, 20, 30, 40, and 50, a pixel driving circuit, and the first and second scan drivers GDC1 and GDC2 (refer to FIG. 3A). The base layer DP_BS may include a pixel circuit area PCA and a driving circuit area DCA. The pixel circuit area PCA may be defined in the first display area DA1 and the first sub-area SA1 of the second display area DA2. The driving circuit area DCA may be defined to overlap the second sub-area SA2 of the second display area DA2 and the non-display area NDA.

In detail, the driving circuit of the pixels PX (refer to FIG. 2B) may be disposed in the pixel circuit area PCA. FIG. 8A shows three pixel transistors TR1, TR2, and TR3 of the driving circuits. The three pixel transistors TR1, TR2, and TR3 may be respectively connected to the three light emitting elements distinguished from each other.

The pixel transistors TR1, TR2, and TR3 may be disposed on the base layer DP_BS. In an embodiment, a first insulating layer 10 may be disposed between the base layer DP_BS and the pixel transistors TR1, TR2, and TR3. The first insulating layer 10 may have a single-layer structure or a multi-layer structure and may include an organic layer, however, embodiments should not be particularly limited.

Each of the pixel transistors TR1, TR2, and TR3 may include a semiconductor pattern SP and a control electrode GE. The semiconductor pattern SP may include a semiconductor material such as silicon or metal oxide.

The semiconductor pattern SP may include a channel area AC, a source area SE, and a drain area DE. The channel area AC, the source area SE, and the drain area DE may be areas distinguished from each other in a plane. The channel area AC may have a relatively low conductivity compared to that of the source area SE and the drain area DE.

In an embodiment, the source area SE and the drain area DE may include a reduced metal. The source area SE and the drain area DE may serve as a source electrode and a drain electrode of a first transistor TR1, respectively, however, this is an example. According to an embodiment, the first transistor TR1 may further include a separate source electrode and drain electrode, which may be connected to the source area SE and the drain area DE, however, embodiments should not be particularly limited.

The control electrode GE may have a conductivity. The control electrode GE may be spaced apart from the semiconductor pattern SP with a second insulating layer 20 interposed therebetween. The control electrode GE may overlap the channel area AC of the semiconductor pattern SP in the plane. The second insulating layer 20 may be an inorganic layer and may have a single-layer structure or a multi-layer structure.

A third insulating layer 30, a fourth insulating layer 40, a fifth insulating layer 50, and a sixth insulating layer 60 may be sequentially stacked on each other on the pixel transistors TR1, TR2, and TR3. Each of the third, fourth, fifth, and sixth insulating layers 30, 40, 50, and 60 may include an organic layer or organic and inorganic layers stacked one on another.

A first connection electrode CN1 may be disposed between the third insulating layer 30 and the fourth insulating layer 40. Multiple first connection electrodes CN1 may be provided, and the first connection electrodes CN1 may be respectively connected to the pixel transistors TR1, TR2, and TR3 after penetrating through the third insulating layer 30 and the second insulating layer 20. In an embodiment, the first connection electrode CN1 may be connected to the drain area DE, however, this is merely an example. The first connection electrode CN1 may be connected to the source area SE, however, embodiments should not be particularly limited.

A second connection electrode CN2 may be disposed between the fourth insulating layer 40 and the fifth insulating layer 50. The second connection electrode CN2 may be connected to the first connection electrode CN1 after penetrating through the fourth insulating layer 40.

Routing lines RL1, RL2_1, and RL3 may be disposed between the fifth insulating layer 50 and the sixth insulating layer 60. The routing lines RL1, RL2_1, and RL3 may be connected to the second connection electrode CN2 after penetrating through the fifth insulating layer 50. Each of the routing lines RL1, RL2_1, and RL3 may be connected to a corresponding light emitting element among light emitting elements R_ED21, R_ED22, G1_ED21, G1_ED22, and B_ED21.

Among the routing lines RL1, RL2_1, and RL3, a first sub-routing line RL2_1 may be connected to a third green light emitting element G1_ED21, a first routing line RL1 may be connected to a second red light emitting element R_ED21, and a third routing line RL3 may be connected to a second blue light emitting element B_ED21. The routing line RL2_1 connected to the third green light emitting element G1_ED21 that may be disposed to overlap a corresponding pixel transistor TR1 may have a length shorter than a length of the routing line RL3 connected to the second blue light emitting element B_ED21 that may not overlap a corresponding pixel transistor TR3.

According to an embodiment, the routing lines RL1, RL2_1, and RL3 and the second connection electrode CN2 may be disposed on different layers from each other, however, the disclosure should not be limited thereto or thereby. As an example, the routing lines RL1, RL2_1, and RL3 and the second connection electrode CN2 may be disposed on the same layer.

According to an embodiment, the routing lines RL1, RL2_1, and RL3 may include a transparent conductive line. The transparent conductive line may include a transparent conductive material or a light transmission material. As an example, the routing lines RL1, RL2_1, and RL3 may be formed of a transparent conductive oxide (TCO) layer, such as indium tin oxide (ITO), indium zinc oxide (IZO), indium gallium zinc oxide (IGZO), zinc oxide (ZnO), and/or indium oxide ($In_2O_3$).

The light emitting element layer DP_EL may be disposed on the circuit layer DP_CL. The light emitting element layer DP_EL may include the light emitting elements R_ED21, R_ED22, G1_ED21, G1_ED22, and B_ED21. As an example, the light emitting element layer DP_EL may include an organic light emitting material, an inorganic light emitting material, an organic-inorganic light emitting material, a quantum dot, a quantum rod, a micro-LED, and/or a nano-LED.

The light emitting elements R_ED21, R_ED22, G1_ED21, G1_ED22, and B_ED21 may be disposed on the sixth insulating layer 60 and may be electrically connected to corresponding pixel transistors TR1, TR2, and TR3 via the routing lines RL1, RL2_1, and RL3. The encapsulation layer 80 may be disposed on the light emitting element layer DP_EL. The encapsulation layer 80 may protect the light emitting element layer DP_EL from moisture, oxygen, and a foreign substance, such as dust particles.

The encapsulation layer 80 may be disposed on the light emitting element layer DP_EL. The encapsulation layer 80 may include a first inorganic encapsulation layer 81, an organic encapsulation layer 82, and a second inorganic encapsulation layer 83, which may be sequentially stacked on each other, however, layers of the encapsulation layer 80 should not be limited thereto or thereby.

The first and second inorganic layers 81 and 83 may protect the light emitting element layer DP_EL from the moisture and oxygen, and the organic layer 82 may protect the light emitting element layer DP_EL from a foreign substance such as dust particles. Each of the first and second inorganic layers 81 and 83 may include a silicon nitride layer, a silicon oxynitride layer, a silicon oxide layer, a titanium oxide layer, or an aluminum oxide layer. The organic layer 82 may include an acrylic-based organic layer, however, embodiments should not be limited thereto or thereby.

Each of the light emitting elements R_ED21, R_ED22, G1_ED21, G1_ED22, and B_ED21 may include a first electrode AE1, a second electrode CE, and a light emitting layer EL1. The first electrode AE1 may be disposed on the sixth insulating layer 60 and may be connected to a corresponding routing line among the routing lines RL1, RL2_1, and RL3 after penetrating through the sixth insulating layer 60. In a case where the routing lines RL1, RL2_1, and RL3 may be disposed on the same layer as the second connection electrode CN2, the first electrode AE1 of the light emitting element, e.g., the third green light emitting element G1_ED21, which may be disposed to overlap the corresponding pixel transistor TR1, may be directly connected to the second connection electrode CN2. The second sub-routing line RL2_1 may be omitted.

The first electrode AE1 may include a reflective layer formed of Ag, Mg, Al, Pt, Pd, Au, Ni, Nd, Ir, Cr, and/or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For instance, the first electrode AE1 may have a stack structure of ITO/Ag/ITO.

A seventh insulating layer 70 may be provided with an opening through which at least a portion of the first electrode AE1 may be exposed. The seventh insulating layer 70 may include an organic material and/or and inorganic material and may correspond to a pixel definition layer.

The light emitting layer EL1 may be disposed in the opening defined through the seventh insulating layer 70. The light emitting layer EL1 may include an organic light emitting material and/or an inorganic light emitting material. The second electrode CE may be disposed on the seventh insulating layer 70. The second electrode CE may have a shape covering the light emitting layers. The second electrode CE may be formed on an entire surface of the first and second display areas DA1 and DA2. The light emitting layer EL1 of each of the light emitting elements R_ED21, R_ED22, G1_ED21, G1_ED22, and B_ED21 may be excited in response to a difference in electric potential between the first electrode AE1 and the second electrode CE to generate the light.

Although not shown in figures, a hole control layer may be disposed between the first electrode AE1 and the light emitting layer EL1. The hole control layer may include a hole transport layer and may further include a hole injection layer. An electron control layer may be disposed between the light emitting layer EL1 and the second electrode CE. The electron control layer may include an electron transport layer and may further include an electron injection layer.

The hole control layer and the electron control layer may be commonly formed in the multiple pixels PX (refer to FIG. 2B) using an open mask.

The light emitting element layer DP_EL may further include connection lines CL1 and CL2_1. The connection lines CL1 and CL2_1 may be disposed in the second display area DA2. A first connection line CL1 between the connection lines CL1 and CL2_1 may connect two red light emitting elements R_ED21 and R_ED22 adjacent to each other, and a first sub-connection line CL2_1 may connect two third green light emitting elements G1_ED21 and G1_ED22 adjacent to each other. The first connection line CL1 and the first sub-connection line CL2_1 may be disposed on the same layer on which the first electrode AE1 may be disposed. The first connection line CL1 and the first sub-connection line CL2_1 may be formed of the same material as that of the first electrode AE1. However, locations of the connection lines CL1 and CL2_1 should not be limited thereto or thereby. As an example, as shown in FIG. 8B, one of connection lines CL1 and CL2_1, e.g., a second sub-connection line CL2_1, may be disposed on the same layer as routing lines RL1, RL2_1, and RL3, and the other of the connection lines CL1 and CL2_1, e.g., a first connection line CL1, may be disposed on the same layer as a first electrode AE1. The first connection line CL1 may be formed of the same material as that of the first electrode AE1, and the second sub-connection line CL2_1 may be formed of the same material as that of the routing lines RL1, RL2_1, and RL3. According to an embodiment, each of connection lines CL1 and CL2_1 may be disposed on the same layer as routing lines RL1, RL2_1, and RL3. Circuit configurations other than the pixel driving circuit, for example, the first and second scan drivers GDC1 and GDC2, the initialization voltage line VIL (refer to FIG. 2B), the first source voltage line VL1 (refer to FIG. 2B), a second source voltage line VL2, etc., may be disposed in the driving circuit area DCA.

The initialization voltage line VIL may be disposed in the second display area DA2 and may overlap the second sub-area SA2.

The first and second scan drivers GDC1 and GDC2 may be disposed in an area overlapping the second sub-area SA2 of the driving circuit area DCA. For the convenience of explanation, FIGS. 8A and 8B show driving transistors TRP1 and TRP2 of the first and second scan drivers GDC1 and GDC2.

The driving transistor TRP1 may include a semiconductor pattern SP, a control electrode E1, an input electrode E2, and an output electrode E3. The driving transistors TRP1 and TRP2 may be formed through the same process as the pixel transistors TR1, TR2, and TR3. The driving transistors TRP1 and TRP2 may not overlap the pixel transistors TR1, TR2, and TR3.

Each of the first and second scan drivers GDC1 and GDC2 may include driving signal lines VD. According to an embodiment, the driving signal lines VD may include first, second, and third lines V1, V2, and V3. The first line V1 may have a size greater than that of the second line V2 and/or the third line V3 in a plane. The first line V1 may be connected to a first driving transistor TRP1 among components of the first and second scan drivers GDC1 and GDC2.

The first line V1 may transmit a constant voltage to the first driving transistor TRP1. The constant voltage may include a gate low voltage or a gate high voltage, however, this is merely an example. According to an embodiment, the first line V1 may be one of various lines that apply the constant voltage to the first and second scan drivers GDC1 and GDC2, and embodiments should not be particularly limited.

According to an embodiment, a source voltage pattern VSS may be disposed on the same layer as the first line V1. The source voltage pattern VSS may be connected to the second source voltage line VL2 and may receive the second driving voltage ELVSS (refer to FIG. 2B).

According to an embodiment, the display panel DP may include dams P0 and P1 and a crack dam CRD. The dams P0 and P1 may be arranged along an edge of the second display area DA2 in a plan view. The dams P0 and P1 may prevent the organic encapsulation layer 82 from overflowing. The dams P0 and P1 may include a first dam P0 and a second dam P1.

The first dam P0 may be disposed closer to the second display area DA2 than the second dam P1 may be. The first dam P0 may overlap the second source voltage line VL2. The first dam P0 may include a first dam layer P01, a second dam layer P02, and a third dam layer P03. Each of the first dam layer P01, the second dam layer P02, and the third dam layer P03 may be formed of an insulating material. In an embodiment, the first dam layer P01 may include the same material as that of the fifth insulating layer 50, and the second dam layer P02 and the third dam layer P03 may include the same material as that of the sixth insulating layer 60 and/or the seventh insulating layer 70.

The second dam P1 may be disposed farther away from the second display area DA2 than the first dam P0 may be. In an embodiment, the second dam P1 may include a first dam layer P11, a second dam layer P12, a third dam layer P13, and a fourth dam layer P14. As an example, the first dam layer P11 may include the same material as that of the fourth insulating layer 40, the second dam layer P12 may include the same material as that of the fifth insulating layer 50, and the third dam layer P13 and the fourth dam layer P14 may include the same material as that of the sixth insulating layer 60 and/or the seventh insulating layer 70. The first dam P0 and the second dam P1 may have the same structure as each other, and additional dam may be further disposed in the non-display area NDA in addition to the first dam P0 and the second dam P1, however, embodiments should not be limited thereto or thereby.

The crack dam CRD may be disposed in the non-display area NDA and may be disposed at ends of the second insulating layer 20 and the third insulating layer 30. The crack dam CRD may include a dam portion DM and a filling portion FL. The dam portion DM may include insulating patterns disposed along an edge of the display panel DP. The insulating patterns may include the same material as that of the second insulating layer 20 and the third insulating layer 30 and may be substantially simultaneously formed with the second insulating layer 20 and the third insulating layer 30.

The filling portion FL may include an organic material. The filling portion FL may include a material with a relatively high flexibility compared with the dam portion DM. The filling portion FL may cover the dam portion DM and may be filled between the insulating patterns.

Although embodiments of the disclosure have been described, it is understood that the disclosure should not be limited to these embodiments but various changes and modifications can be made by one of ordinary skill in the art within the spirit and scope of the disclosure as hereinafter claimed. Therefore, the disclosed subject matter should not be limited to any single embodiment described herein.

What is claimed is:

1. A display device comprising:

a display panel including:

a first display area; and a second display area adjacent to the first display area; and a panel driver overlapping the second display area of the display panel, wherein the display panel further includes:

light emitting reference units each including light emitting elements and being disposed in the second display area; and driving reference units each including driving circuits and being electrically connected to a corresponding light emitting reference unit among the light emitting reference units, an arrangement order of the light emitting reference units is different from an arrangement order of the driving reference units corresponding to the light emitting reference units, the second display area includes:

a first sub-area adjacent to the first display area; and a second sub-area overlapping the panel driver, the first sub-area is disposed between the second sub-area and the first display area, the light emitting reference units include:

first light emitting reference units overlapping the first sub-area; and second light emitting reference units overlapping the second sub-area, the driving reference units are disposed in the first sub-area, and the driving reference units comprise:

first driving reference units electrically connected to the first light emitting reference units; and second driving reference units electrically connected to the second light emitting reference units, the display panel further comprises:

a first group of routing lines electrically connecting the first light emitting reference units to the first driving reference units; and a second group of routing lines electrically connecting the second light emitting reference units to the second driving reference units, wherein the first group of routing lines cross the second group of routing lines in the first sub-area.

2. The display device of claim 1, wherein the first driving reference units are alternately arranged with the second driving reference units.

3. The display device of claim 2, wherein each of the first driving reference units overlaps a corresponding first light emitting reference unit electrically connected thereto among the first light emitting reference units, and each of the second driving reference units does not overlap a corresponding second light emitting reference unit electrically connected thereto among the second light emitting reference units.

4. The display device of claim 2, wherein the routing lines of the first group have a length shorter than a length of the routing lines of the second group.

5. The display device of claim 1, wherein each of the light emitting elements is driven by a corresponding driving circuit of the driving circuits.

6. The display device of claim 5, wherein a number of the light emitting elements is greater than a number of the driving circuits.

7. The display device of claim 6, wherein the number of the light emitting elements is two, three, or four times of the number of the driving circuits.

8. The display device of claim 6, wherein, in case that the number of the light emitting elements is two times of the number of the driving circuits:

each of the light emitting reference units overlaps two driving reference units;

each of the light emitting reference units is electrically connected to a first driving reference unit of the two driving reference units and is not electrically connected to a second driving reference unit of the two driving reference units; and the driving reference unit is alternatively arranged with the second driving reference unit.

9. The display device of claim 6, wherein, in case that the number of the light emitting elements is three times of the number of the driving circuits:

each of the light emitting reference units overlaps three driving reference units;

each of the light emitting reference units is electrically connected to a first driving reference unit of the three driving reference units and is not electrically connected to a second and third driving reference unit of the three driving reference units; and the first, second, and third driving reference unit is alternatively arranged with the second driving reference unit.

10. The display device of claim 6, wherein the light emitting elements comprise:

first color light emitting elements emitting a first color light;

second color light emitting elements emitting a second color light; and third color light emitting elements emitting a third color light.

11. The display device of claim 10, wherein a number of the second color light emitting elements is greater than a number of the first color light emitting elements in each of the light emitting reference units.

12. The display device of claim 11, wherein the driving circuits comprise:

a first driving circuit electrically connected to the first color light emitting elements;

a second driving circuit electrically connected to the second color light emitting elements; and a third driving circuit electrically connected to the third color light emitting elements.

13. The display device of claim 12, wherein the second driving circuit comprises:

a first sub-driving circuit electrically connected to a first group among the second color light emitting elements; and a second sub-driving circuit electrically connected to a second group among the second color light emitting elements.

14. The display device of claim 13, wherein the display panel further comprises:

a first connection line electrically connecting the first color light emitting elements;

a first sub-connection line electrically connecting the second color light emitting elements of the first group;

a second sub-connection line electrically connecting the second color light emitting elements of the second group; and a third connection line electrically connecting the third color light emitting elements.

15. The display device of claim 14, wherein each of the first, second, and third color light emitting elements comprise:

a first electrode;

a light emitting layer; and a second electrode, and the first and third connection lines and the first and second sub-connection lines and the first electrode are disposed on a same layer.

16. The display device of claim 14, wherein the display panel further comprises:

a first routing line electrically connecting one of the first color light emitting elements to the first driving circuit;

a first sub-routing line electrically connecting one of the second color light emitting elements of the first group to the first sub-driving circuit;

a second sub-routing line electrically connecting one of the second color light emitting elements of the second group to the second sub-driving circuit; and a third routing line electrically connecting one of the third color light emitting elements to the third driving circuit.

17. The display device of claim 16, wherein the first routing line, the first and second sub-routing lines, and the third routing line include a transparent conductive material.

18. A display device comprising:

a display panel including:

a first display area; and a second display area adjacent to the first display area; and a panel driver driving the display panel, wherein the second display area includes:

a first sub-area adjacent to the first display area; and a second sub-area overlapping the panel driver, the display panel further includes:

first light emitting elements disposed in the first sub-area;

second light emitting elements disposed in the second sub-area;

first pixel driving circuits disposed in the first sub-area and electrically connected to each of the first light emitting elements; and second pixel driving circuits disposed in the first sub-area and electrically connected to each of the second light emitting elements, each of the first light emitting elements overlaps a corresponding first pixel driving circuit electrically connected thereto, and each of the second light emitting elements is disposed not to overlap a corresponding second pixel driving circuits electrically connected thereto, the display panel further includes:

first routing lines electrically connecting the first light emitting elements to the first pixel driving circuits; and second routing lines electrically connecting the second light emitting elements to the second pixel driving circuits, wherein the first routing lines cross the second routing lines in the first sub-area.

19. The display device of claim 18, wherein the first pixel driving circuits are alternately arranged with the second pixel driving circuits in the first sub-area.

20. The display device of claim 18, wherein the display panel further includes:

reference light emitting elements disposed in the first display area, wherein each of the first and second light emitting elements has a size greater than a size of a reference light emitting element among the reference light emitting elements, and the reference light emitting element and the first and second light emitting elements emit a same color.

* * * * *